(12) United States Patent
Baba

(10) Patent No.: US 11,949,144 B2
(45) Date of Patent: Apr. 2, 2024

(54) STRUCTURE FOR MOUNTING A TRANSMISSION LINE SUBSTRATE HAVING INTERLAYER CONNECTION CONDUCTORS TO ANOTHER SUBSTRATE BY A CONDUCTIVE BONDING MATERIAL

(71) Applicant: Murata Manufacturing Co., Ltd., Nagaokakyo (JP)

(72) Inventor: Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 261 days.

(21) Appl. No.: 17/380,065

(22) Filed: Jul. 20, 2021

(65) Prior Publication Data

US 2021/0351486 A1 Nov. 11, 2021

Related U.S. Application Data

(63) Continuation of application No. PCT/JP2020/011880, filed on Mar. 18, 2020.

(30) Foreign Application Priority Data

Mar. 20, 2019 (JP) .................................. 2019-052522

(51) Int. Cl.
*H01P 5/02* (2006.01)
*H01P 3/00* (2006.01)
(Continued)

(52) U.S. Cl.
CPC .............. *H01P 5/028* (2013.01); *H01P 3/003* (2013.01); *H01P 3/082* (2013.01); *H01P 3/088* (2013.01); *H05K 1/0242* (2013.01)

(58) Field of Classification Search
CPC ........... H01P 3/082; H01P 3/088; H01P 5/028
(Continued)

(56) References Cited

U.S. PATENT DOCUMENTS

2006/0145778 A1 7/2006 Pleva et al.
2016/0028140 A1* 1/2016 Kato ........................ H01P 3/08
333/238

(Continued)

FOREIGN PATENT DOCUMENTS

JP 2006-191077 A 7/2006
JP 2008-263360 A 10/2008
(Continued)

OTHER PUBLICATIONS

Official Communication issued in International Patent Application No. PCT/JP2020/011880, dated Jun. 16, 2020.

*Primary Examiner* — Benny T Lee
(74) *Attorney, Agent, or Firm* — Keating & Bennett, LLP

(57) ABSTRACT

A transmission line substrate includes a line portion and a connecting portion. The transmission line substrate includes a base material, a first ground conductor, a second ground conductor, a signal line, an external electrode, a second interlayer connection conductor. In the line portion, a transmission line having a strip line structure including the signal line, the first ground conductor, and the second ground conductor is provided. In the connecting portion, the signal line and the external electrode face each other in a stacking direction, without including therebetween an interlayer connection conductor. The second interlayer connection conductor surrounds a facing portion in which the signal line and the external electrode face each other in the Z-axis direction.

19 Claims, 26 Drawing Sheets

(51) Int. Cl.
  *H01P 3/08*     (2006.01)
  *H05K 1/02*     (2006.01)
(58) Field of Classification Search
  USPC .................................................. 333/238, 246
  See application file for complete search history.

(56) References Cited

U.S. PATENT DOCUMENTS

| | | | |
|---|---|---|---|
| 2016/0380325 A1* | 12/2016 | Kato et al. | H01P 3/082 |
| | | | 343/772 |
| 2017/0033426 A1 | 2/2017 | Baba et al. | |
| 2019/0387626 A1 | 12/2019 | Baba | |

FOREIGN PATENT DOCUMENTS

| | | |
|---|---|---|
| WO | 2016/088693 A1 | 6/2016 |
| WO | 2018/180413 A1 | 10/2018 |

* cited by examiner

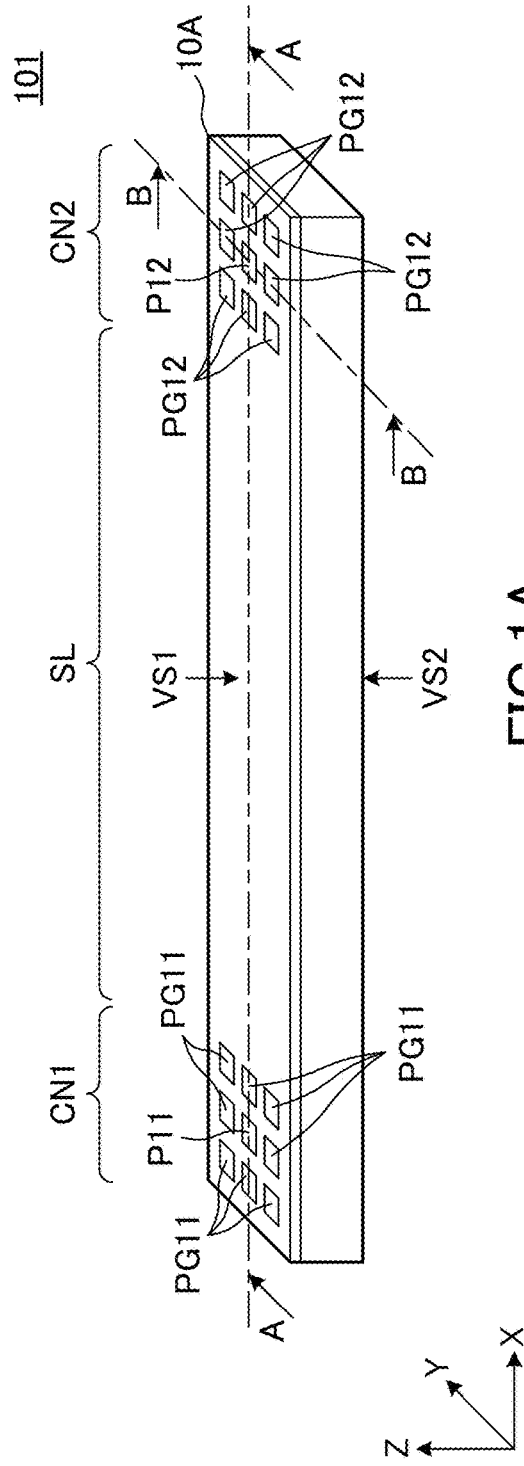
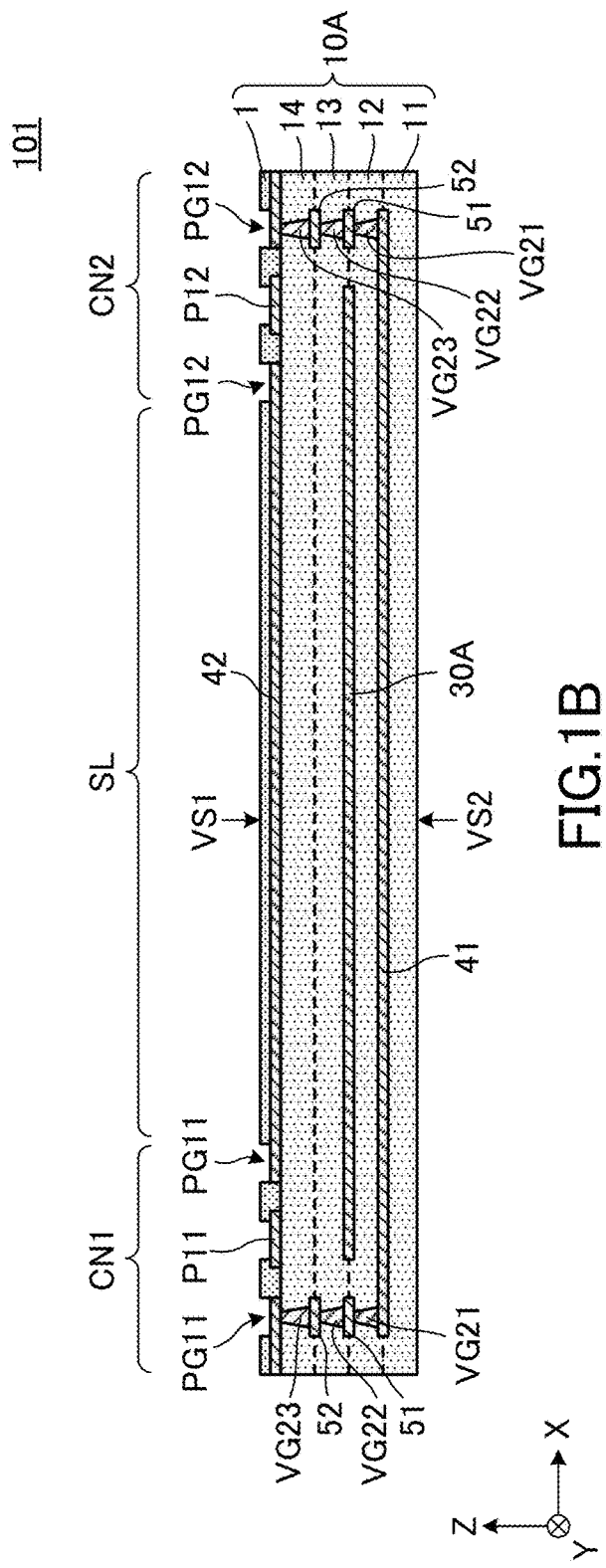
FIG.1A
FIG.1B

COMPARATIVE EXAMPLE

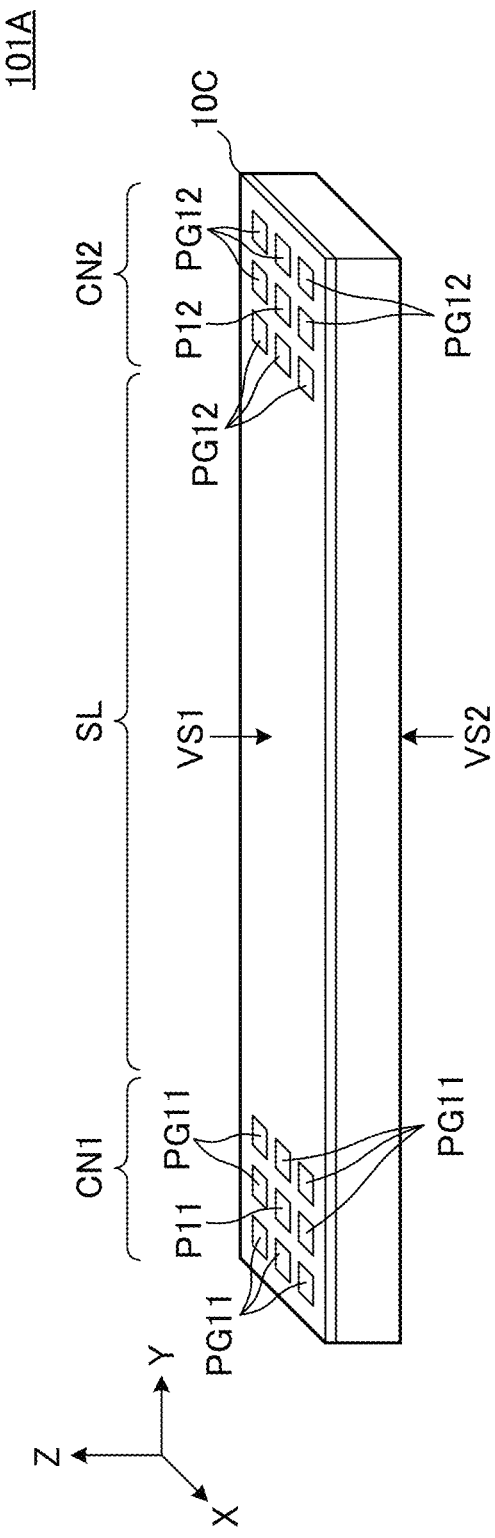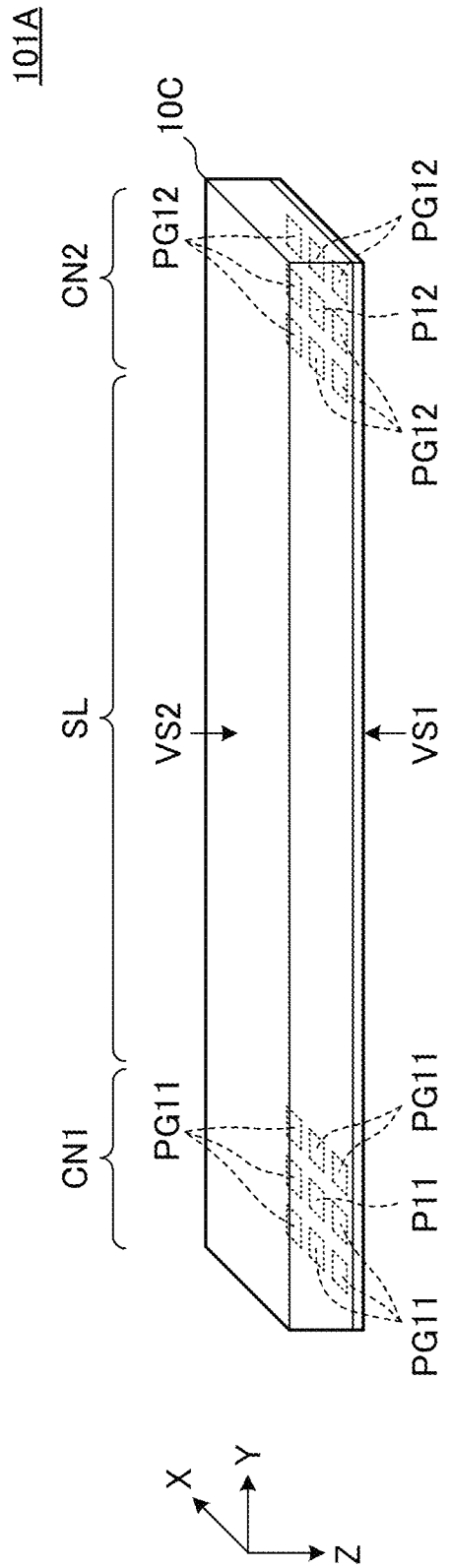

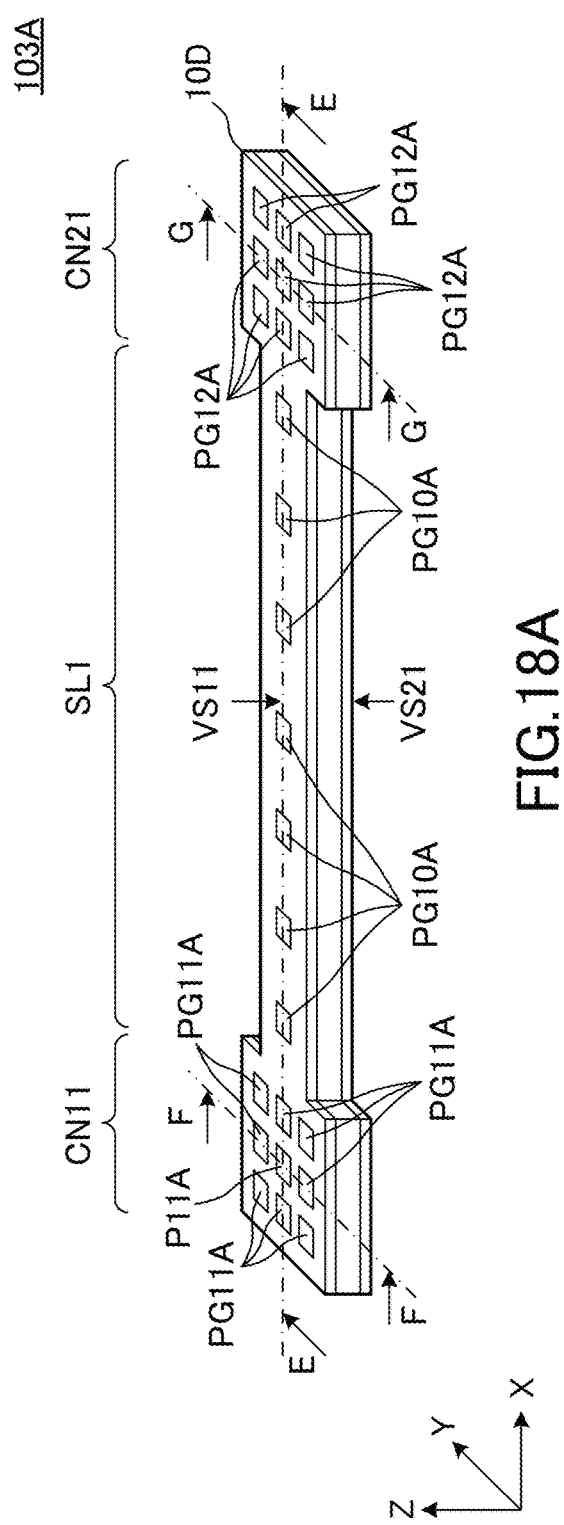
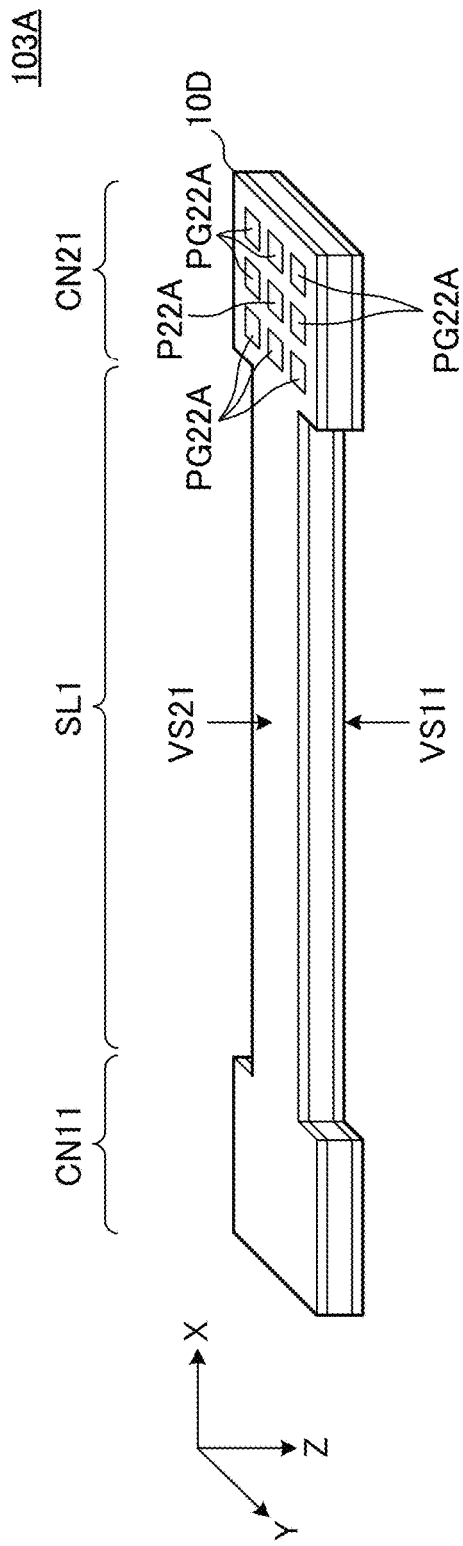
FIG.18A
FIG.18B

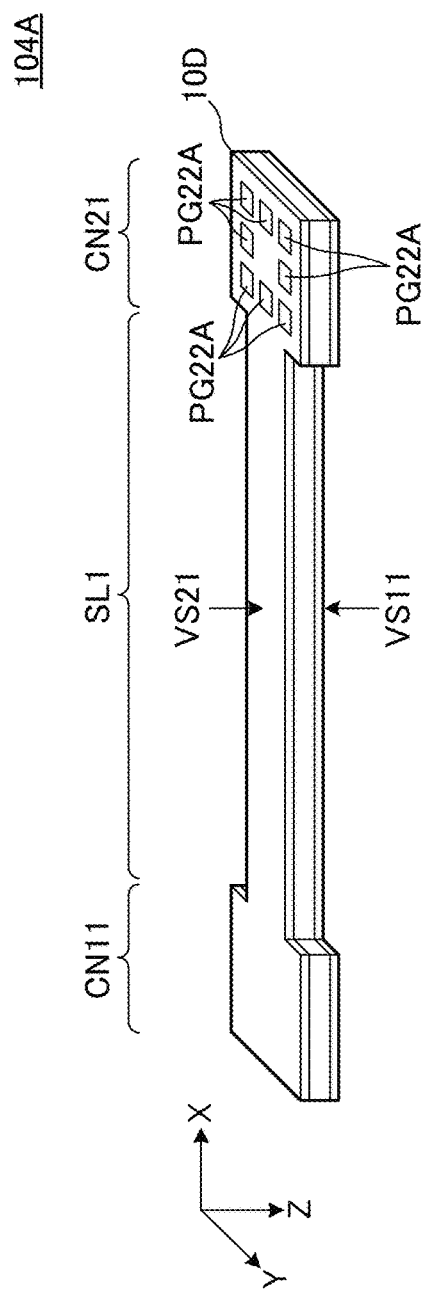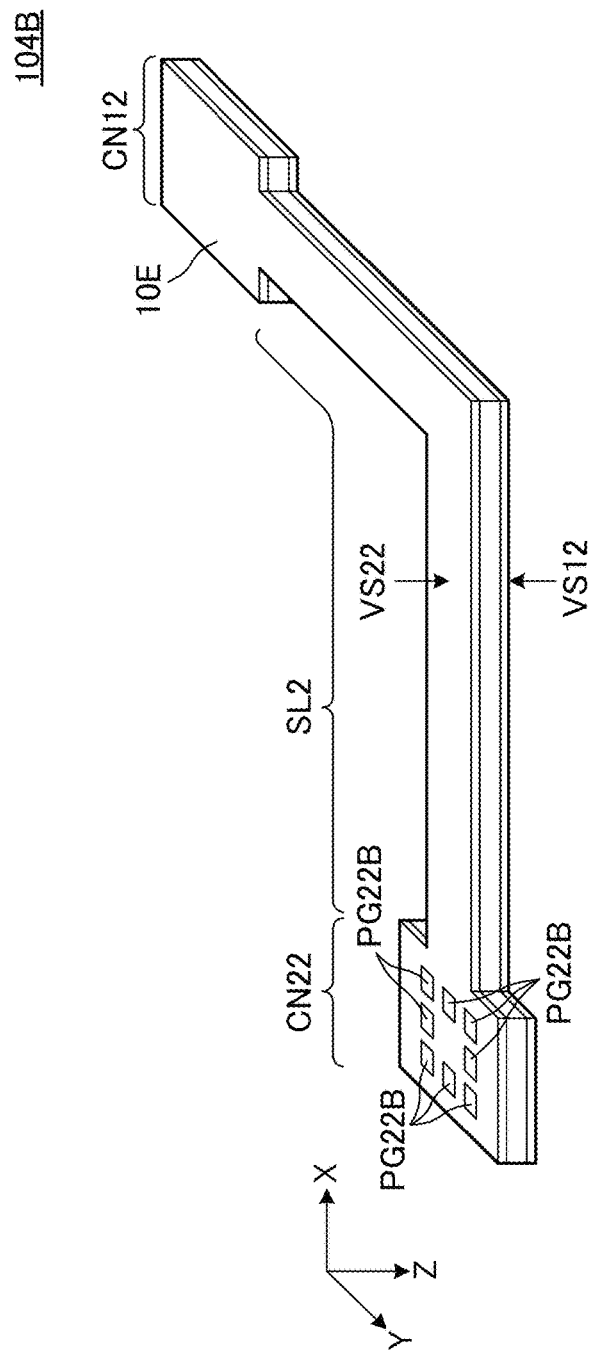

STRUCTURE FOR MOUNTING A TRANSMISSION LINE SUBSTRATE HAVING INTERLAYER CONNECTION CONDUCTORS TO ANOTHER SUBSTRATE BY A CONDUCTIVE BONDING MATERIAL

CROSS REFERENCE TO RELATED APPLICATIONS

This application claims the benefit of priority to Japanese Patent Application No. 2019-052522 filed on Mar. 20, 2019 and is a Continuation Application of PCT Application No. PCT/JP2020/011880 filed on Mar. 18, 2020. The entire contents of each application are hereby incorporated herein by reference.

BACKGROUND OF THE INVENTION

1. Field of the Invention

The present invention relates to a transmission line substrate in which a transmission line with a strip line structure is provided on a base material including a plurality of base material layers that are stacked on each other, and to a structure of mounting a transmission line substrate.

2. Description of the Related Art

Conventionally, a transmission line substrate in which a transmission line with a strip line structure is provided on a base material including a plurality of base material layers that are stacked on each other has been known.

For example, International Publication No. 2016/088693 discloses a transmission line substrate that includes a base material including a plurality of base material layers that are stacked on each other, and a plurality of conductor patterns (a signal line, a first ground conductor, a second ground conductor, and an external electrode) provided on the plurality of base material layers. A high frequency transmission line including the signal line, and the first ground conductor and the second ground conductor between which the signal line is located in a stacking direction in which the plurality of base material layers are stacked on each other is provided in the transmission line substrate.

Since the transmission line substrate has a strip line structure, in a case in which the transmission line substrate is connected to a different substrate or the like, the signal line provided in the transmission line substrate needs to be extended to the surface of the transmission line substrate. Specifically, the signal line is connected to the external electrode provided on the surface of the transmission line substrate through an interlayer connection conductor, and the external electrode is connected to another circuit substrate through a conductive bonding material, such as solder.

The transmission line substrate is manufactured by stacking, heating, and pressing a plurality of base material layers including a plurality of conductor patterns and interlayer connection conductors.

However, when the plurality of base material layers are stacked on each other, a positional shift may occur. With such a positional shift, a variation in a positional relationship of the signal line, the interlayer connection conductor, and the external electrode may occur, and return loss may occur between the signal line and the external electrode (at a portion in which the signal line is extended to the surface of the transmission line substrate). Particularly, in a case in which the number of the base material layers between the signal line and the external electrode is large and the number of interlayer connection conductors that connect the signal line and the external electrode is large (in a case in which the interlayer connection conductors are connected at a large number of portions), impedance matching is difficult and return loss easily occurs. This becomes more significant as the frequency of a transmission signal is higher.

SUMMARY OF THE INVENTION

Preferred embodiments of the present invention provide transmission line substrates each including a transmission line with a strip line structure provided on a base material including a plurality of base material layers that are stacked on each other, each of the transmission line substrates being able to significantly reduce or prevent return loss at an intermediate portion of a transmission path, and structures of mounting such transmission line substrates.

A transmission line substrate according to a preferred embodiment of the present invention includes a line portion, a connecting portion, a base material including a main surface and a plurality of base material layers that are stacked on each other, a first ground conductor on the base material, a second ground conductor on the base material, a signal line on the base material, an external electrode of the connecting portion that is on the main surface, and a plurality of interlayer connection conductors on the base material, and, in the line portion, a transmission line with a strip line structure including the signal line, the first ground conductor, and the second ground conductor is provided, in the connecting portion, the signal line and the external electrode face each other in a stacking direction in which the plurality of base material layers are stacked on each other, without interposing an interlayer connection conductor therebetween, the plurality of interlayer connection conductors include a plurality of first interlayer connection conductors and a plurality of second interlayer connection conductors that electrically connect the first ground conductor and the second ground conductor, the plurality of first interlayer connection conductors are provided at the line portion, and, when viewed in the stacking direction, are provided along the signal line, the plurality of second interlayer connection conductors are provided at the connecting portion, and surround a facing portion in which the signal line and the external electrode face each other in the stacking direction, and an interval of the plurality of second interlayer connection conductors is smaller than an interval of the plurality of first interlayer connection conductors.

In a case in which the signal line provided in the base material and the external electrode provided on a surface of the base material are connected to each other by an interlayer connection conductor, due to a positional shift when the base material is formed (when the plurality of base material layers are stacked), a variation in a positional relationship of the signal line, the interlayer connection conductor, and the external electrode may occur. Therefore, return loss may occur between the signal line and the external electrode (at a portion of the transmission path extending to the surface of the transmission line substrate). Particularly, in a case in which the number of interlayer connection conductors that connect the signal line and the external electrode is large, return loss easily occurs. In contrast, with the above features, the facing portion of the signal line and the external electrode defines and functions, in a connecting portion, as a waveguide extending in the stacking direction. Accordingly, without directly connecting the signal line and the external electrode (without interposing the interlayer connection conductor therebetween), a signal is able to be transmitted between the signal line and the external electrode, and the occurrence of return loss with the positional shift when the base material is formed is able to be significantly reduced or prevented.

A structure of mounting a transmission line substrate according to a preferred embodiment of the present invention, the structure mounting a transmission line substrate to a different substrate by a conductive bonding material, and the transmission line substrate includes a line portion, a connecting portion, a base material including a main surface and a plurality of base material layers that are stacked on each other, a first ground conductor on the base material, a second ground conductor on the base material, a signal line on the base material, a first external electrode of the connecting portion that is on the main surface, and a plurality of interlayer connection conductors on the base material, and, in the line portion, a transmission line with a strip line structure including the signal line, the first ground conductor, and the second ground conductor is provided, in the connecting portion, the signal line and the first external electrode face each other in a stacking direction in which the plurality of base material layers are stacked on each other, without interposing an interlayer connection conductor therebetween, the plurality of interlayer connection conductors include a plurality of first interlayer connection conductors and a plurality of second interlayer connection conductors that electrically connect the first ground conductor and the second ground conductor, the plurality of first interlayer connection conductors are provided at the line portion, and, when viewed in the stacking direction, are provided along the signal line, the plurality of second interlayer connection conductors are provided at the connecting portion, and surround a facing portion in which the signal line and the first external electrode face each other in the stacking direction, an interval of the plurality of second interlayer connection conductors is smaller than an interval of the plurality of first interlayer connection conductors, the different substrate includes a substrate electrode on a main surface, and the first external electrode is bonded to the substrate electrode through the conductive bonding material.

A structure of mounting a transmission line substrate according to a preferred embodiment of the present invention, the structure mounting a transmission line substrate to a different substrate by a conductive bonding material, and the transmission line substrate includes a line portion, a connecting portion, a base material including a main surface and a plurality of base material layers that are stacked on each other, a first ground conductor on the base material, a second ground conductor on the base material, a signal line on the base material, a first ground electrode of the connecting portion, the first ground electrode being on the main surface and being electrically connected to the first ground conductor and the second ground conductor, and a plurality of interlayer connection conductors provided on the base material, and, in the line portion, a transmission line having a strip line structure including the signal line, the first ground conductor, and the second ground conductor is provided, the different substrate includes a substrate signal line, and a substrate ground electrode provided on a surface, the first ground electrode is bonded to the substrate ground electrode through the conductive bonding material, while the transmission line substrate is mounted on the different substrate, the signal line of the connecting portion and the substrate signal line face each other in a stacking direction in which the plurality of base material layers are stacked on each other, without an interlayer connection conductor and a conductive bonding material, the plurality of interlayer connection conductors include a plurality of first interlayer connection conductors and a plurality of second interlayer connection conductors that electrically connect the first ground conductor and the second ground conductor, the plurality of first interlayer connection conductors are provided at the line portion, and, when viewed in the stacking direction, are provided along the signal line, while the transmission line substrate is mounted on the different substrate, the plurality of second interlayer connection conductors are provided at the connecting portion, and, when viewed in the stacking direction, surround a facing portion in which the signal line and the substrate signal line face each other, and an interval of the plurality of second interlayer connection conductors is smaller than an interval of the plurality of first interlayer connection conductors.

Accordingly, structures of mounting a transmission line substrate that each significantly reduce or prevent the occurrence of return loss with a positional shift during manufacturing are able to be provided.

According to preferred embodiments of the present invention, transmission line substrates each including a transmission line with a strip line structure provided on a base material including a plurality of base material layers that are stacked on each other, the transmission line substrates each being able to significantly reduce or prevent return loss at an intermediate portion of a transmission path, and structures of mounting such transmission line substrates are each able to be provided.

The above and other elements, features, steps, characteristics, and advantages of the present invention will become more apparent from the following detailed description of the preferred embodiments with reference to the attached drawings.

BRIEF DESCRIPTION OF THE DRAWINGS

FIG. 1A is an external perspective view of a transmission line substrate according to a first preferred embodiment of the present invention, and FIG. 1B is a cross-sectional view taken along line A-A in FIG. 1A.

FIG. 17A is an external perspective view of a transmission line substrate according to the third preferred embodiment of the present invention, and FIG. 17B is an external perspective view of the transmission line substrate viewed from a different viewpoint.

FIG. 18A is an external perspective view of a transmission line substrate according to the third preferred embodiment of the present invention, and FIG. 18B is an external perspective view of the transmission line substrate viewed from a different viewpoint.

FIG. 26A is an external perspective view of a transmission line substrate according to the fourth preferred embodiment, and FIG. 26B is an external perspective view of a transmission line substrate according to the fourth preferred embodiment of the present invention.

DETAILED DESCRIPTION OF THE PREFERRED EMBODIMENTS

Figure 2:
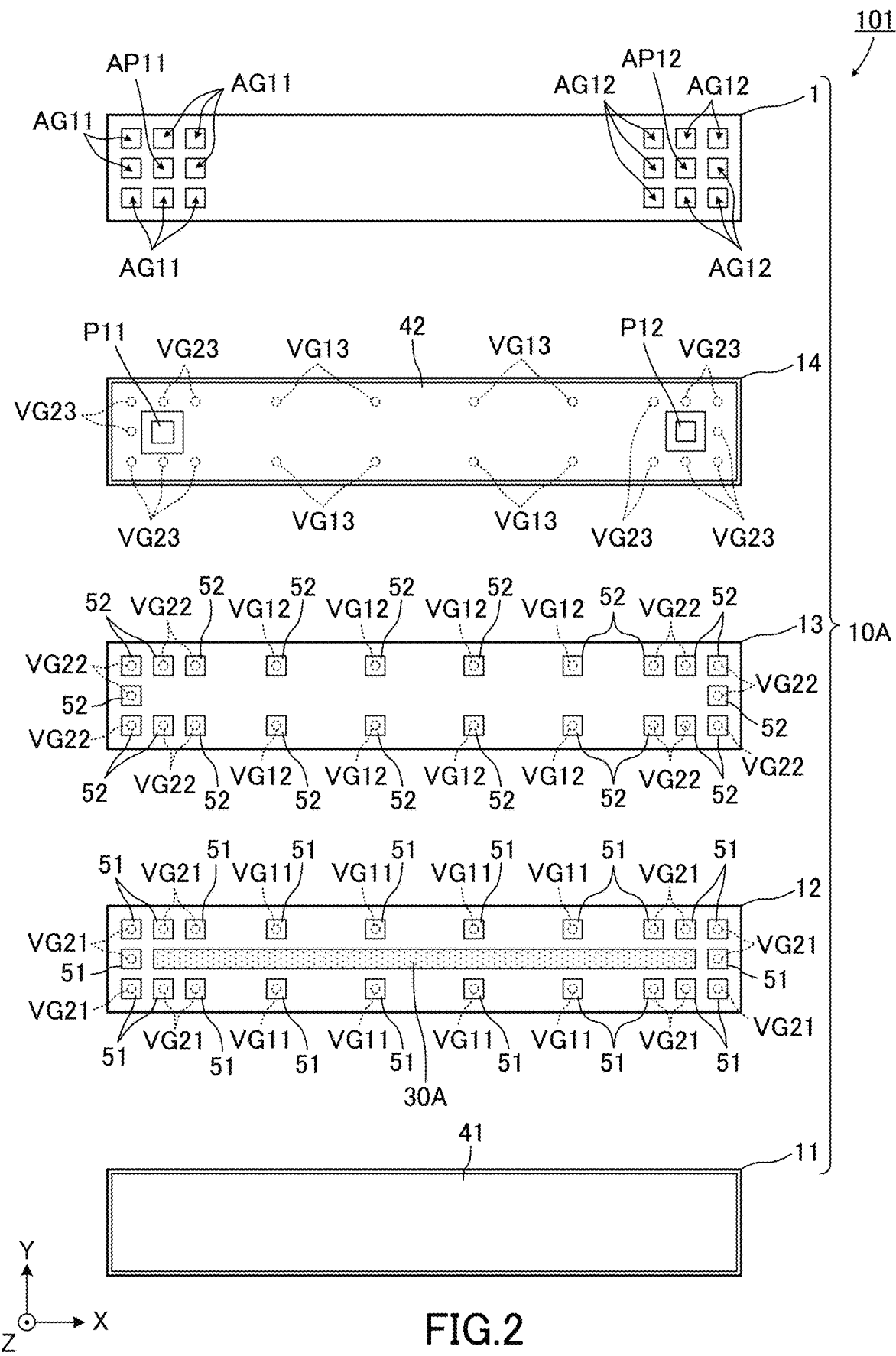
FIG. 2 is an exploded plan view of the transmission line substrate.

Hereinafter, preferred embodiments of the present invention will be described with reference to the attached drawings and several specific examples. In the drawings and the detailed description thereof, components and elements assigned with the same reference numerals or symbols will represent identical or substantially identical components and elements. While preferred embodiments of the present invention are divided and described for the sake of convenience in consideration of ease of description or understanding of main points, elements described in different preferred embodiments are able to be partially replaced and combined with each other. In the second and subsequent preferred embodiments, a description of matters common to the first preferred embodiment will be omitted and only different points will be described. In particular, the same or similar advantageous functions and effects by the same or similar features will not be described one by one for each preferred embodiment.

First Preferred Embodiment

Figure 3A:
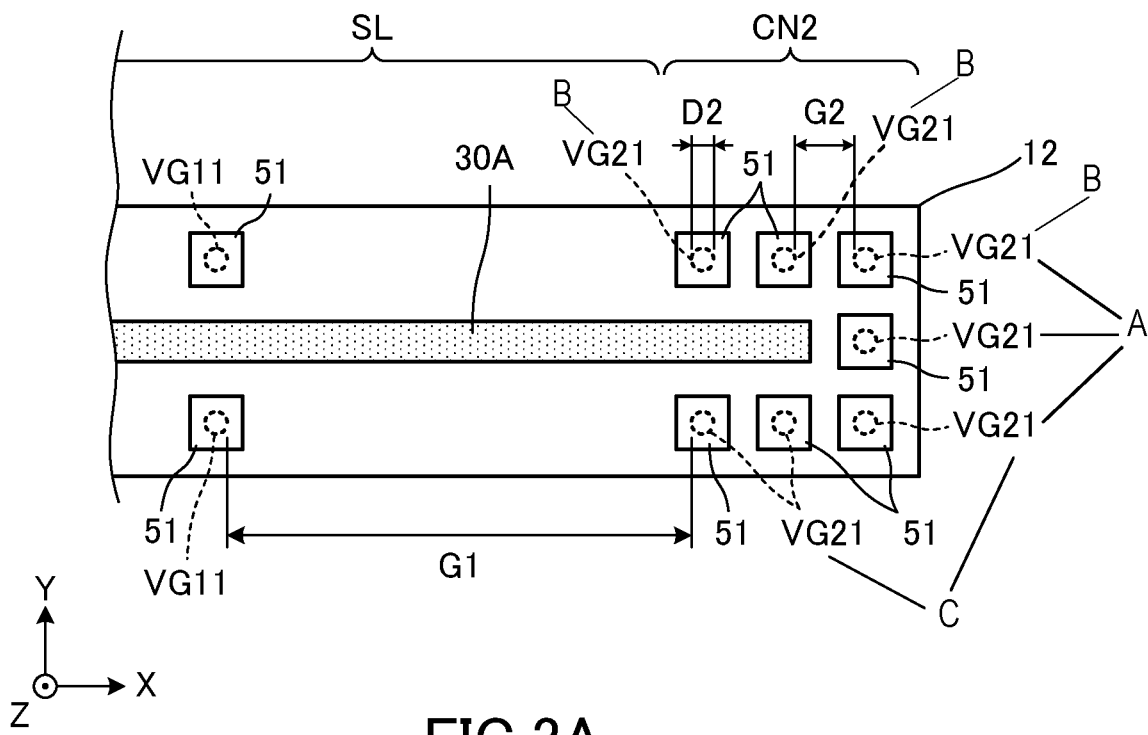
FIG. 3A is an enlarged plan view of a base material layer near a connecting portion of the transmission line substrate.
Figure 3B:
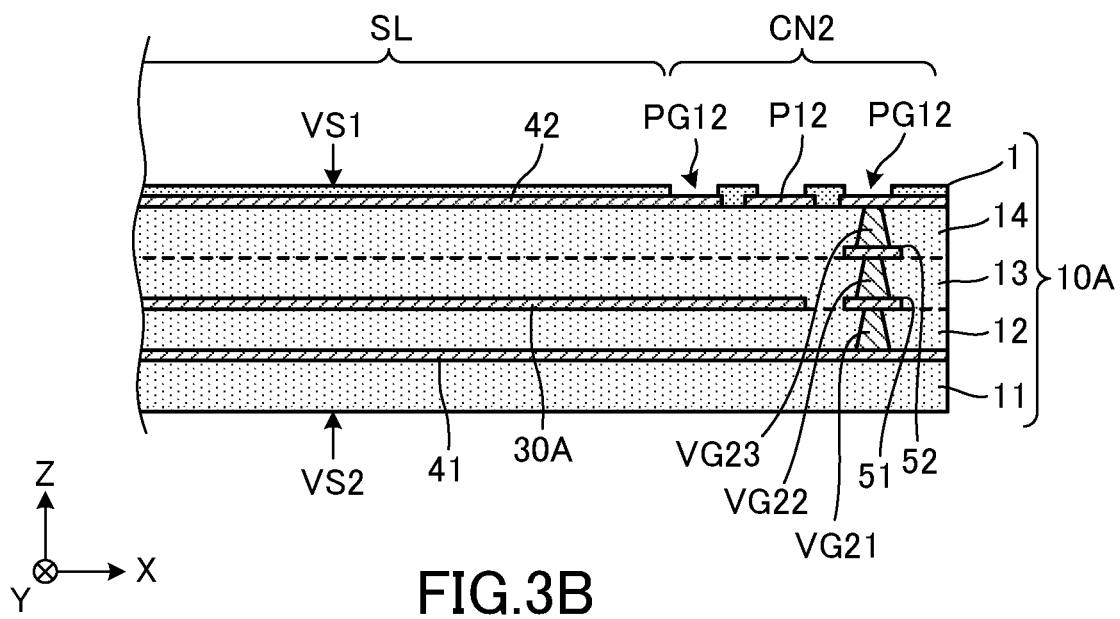
FIG. 3B is a cross-sectional view of the base material layer.
Figure 4:
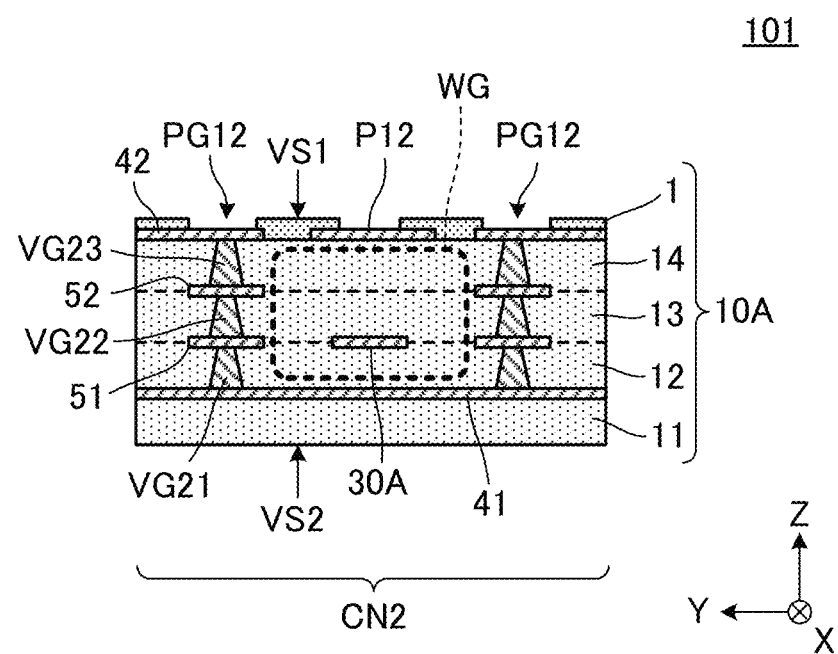
FIG. 4 is a cross-sectional view taken along line B-B in FIG. 1A.

FIG. 1A is an external perspective view of a transmission line substrate 101 according to a first preferred embodiment of the present invention, and FIG. 1B is a cross-sectional view taken along line A-A in FIG. 1A. FIG. 2 is an exploded plan view of the transmission line substrate 101. FIG. 3A is an enlarged plan view of a base material layer 12 near a connecting portion CN2 of the transmission line substrate 101, and FIG. 3B is a cross-sectional view of the base material layer 12. FIG. 4 is a cross-sectional view taken along line B-B in FIG. 1A. In FIG. 2 and FIG. 3A, a signal line 30A is shown by a dot pattern to clarify the structure.

A transmission line substrate 101 according to the present preferred embodiment of the present invention is an electronic component to be mounted on a single circuit substrate, or a cable to connect a plurality of circuit substrates, for example.

The transmission line substrate 101 includes connecting portions CN1 and CN2, and a line portion SL. The connecting portions CN1 and CN2 are portions to be connected to another substrate. As will be described herein, in the line portion SL, a transmission line of a strip line structure that connects the connecting portions CN1 and CN2 is provided. In the transmission line substrate 101, the connecting portion CN1, the line portion SL, and the connecting portion CN2 are provided in this order in a positive X direction.

The transmission line substrate 101 includes a base material 10A, a signal line 30A, a first ground conductor 41, a second ground conductor 42, intermediate ground conductors 51 and 52, external electrodes P11 and P12, ground electrodes PG11 and PG12, a plurality of first interlayer connection conductors VG11, VG12, and VG13, and a plurality of second interlayer connection conductors VG21, VG22, and VG23.

The base material 10A is a flat plate having a rectangular or substantially rectangular shape of which the longitudinal direction coincides with an X-axis direction, and includes a first main surface VS1 and a second main surface VS2 that face each other. The external electrode P11 is provided on the first main surface VS1 of the connecting portion CN1, and the external electrode P12 is provided on the first main surface VS1 of the connecting portion CN2. The signal line 30A, the first ground conductor 41, the second ground conductor 42, the intermediate ground conductors 51 and 52, the plurality of first interlayer connection conductors VG11 to VG13, and the plurality of second interlayer connection conductors VG21 to VG23 are provided in the base material 10A. The plurality of first interlayer connection conductors VG11 to VG13 are provided only at the line portion SL, and the plurality of second interlayer connection conductors VG21 to VG23 are provided only at the connecting portions CN1 and CN2.

In the present preferred embodiment, the external electrodes P11 and P12 each correspond to a "first external electrode", and the ground electrodes PG11 and PG12 each correspond to a "first ground electrode". The "first external electrode" and "first ground electrode" each refer to an electrode to be bonded to a substrate electrode of a different substrate.

The base material 10A is provided by stacking a plurality of base material layers 11, 12, 13, and 14 and a protective layer 1 in this order. Each of the plurality of base material layers 11 to 14 has flexibility and is a resin (for example, thermoplastic resin) flat plate having a rectangular or substantially rectangular shape of which the longitudinal direction coincides with the X-axis direction. The plurality of base material layers 11 to 14 are sheets including a liquid crystal polymer (LCP) or a polyether ether ketone (PEEK), for example, as a main material. The protective layer 1 may be a coverlay film, a solder resist film, or an epoxy resin film, for example.

The first ground conductor 41 is provided on a front surface of the base material layer 11. The first ground conductor 41 is a conductor pattern provided on the entire or substantially the entire front surface of the base material layer 11. The first ground conductor 41 may be a conductor pattern such as Cu foil, for example.

The signal line 30A and a plurality of intermediate ground conductors 51 are provided on a front surface of the base material layer 12. The signal line 30A is a linear conductor pattern extending in a transmission direction (the X-axis direction). The plurality of intermediate ground conductors 51 are rectangular or substantially rectangular conductors that are provided along the outer periphery of the base material layer 12. The signal line 30A and the plurality of intermediate ground conductors 51 may be conductor patterns such as Cu foil, for example.

In addition, a plurality of first interlayer connection conductors VG11 and a plurality of second interlayer connection conductors VG21 are provided in the base material layer 12. The plurality of first interlayer connection conductors VG11 and the plurality of second interlayer connection conductors VG21 are via conductors provided, for example, by filling a through hole in the base material layer 12 with a conductive bonding material (conductive paste) including a resin material and solidifying the conductive bonding material by a heating and pressing process.

A plurality of intermediate ground conductors 52 are provided on a front surface of the base material layer 13. The plurality of intermediate ground conductors 52 are rectangular or substantially rectangular conductor patterns that are provided along the outer periphery of the base material layer 13. The plurality of intermediate ground conductors 52 may be conductor patterns such as Cu foil, for example.

In addition, a plurality of first interlayer connection conductors VG12 and a plurality of second interlayer connection conductors VG22 are provided in the base material layer 13. The plurality of first interlayer connection conductors VG12 and the plurality of second interlayer connection conductors VG22 are via conductors provided, for example, by solidifying a conductive bonding material including a resin material by a heating and pressing process.

The external electrodes P11 and P12 and the second ground conductor 42 are provided on a front surface of the base material layer 14. The external electrode P11 is a rectangular or substantially rectangular conductor pattern located near a first end (the left end of the base material layer 14 in FIG. 2) of the base material layer 14. The external electrode P12 is a rectangular or substantially rectangular conductor pattern located near a second end (the right end of the base material layer 14 in FIG. 2) of the base material layer 14. The second ground conductor 42 is a rectangular or substantially rectangular conductor pattern provided on an entire or substantially entire front surface of the base material layer 14. The external electrodes P11 and P12 and the second ground conductor 42 may be conductor patterns such as Cu foil, for example.

In addition, a plurality of first interlayer connection conductors VG13 and a plurality of second interlayer connection conductors VG23 are provided in the base material layer 14. The plurality of first interlayer connection conductors VG13 and the plurality of second interlayer connection conductors VG23 are via conductors provided, for example, by solidifying a conductive bonding material including a resin material by a heating and pressing process.

The protective layer 1 is provided on a front surface of the base material layer 14, and the planar shape of the protective layer 1 is the same or substantially the same as the planar shape of the base material layer 14. The protective layer 1 includes rectangular or substantially rectangular openings AP11, AP12, AG11, and AG12. The openings AP11 and AG11 are located near a first end (the left end of the protective layer 1 in FIG. 2) of the protective layer 1, and the openings AP12 and AG12 are located near a second end (the right end of the protective layer 1 in FIG. 2) of the protective layer 1. Specifically, the opening AP11 is provided at a position corresponding to a position of the external electrode P11, and the opening AP12 is provided at a position corresponding to a position of the external electrode P12. Therefore, even when the protective layer 1 is provided on the front surface of the base material layer 14, the external electrode P11 is exposed from the opening AP11 to the outside, and the external electrode P12 is exposed from the opening AP12 to the outside. In addition, when the protective layer 1 is provided on the front surface of the base material layer 14, a portion of the second ground conductor 42 is exposed from the openings AG11 and AG12 to the outside. In the present preferred embodiment, the portion of the second ground conductor 42 that is exposed from each of the openings AG11 and AG12 corresponds to the ground electrode (PG11, PG12).

As shown in FIG. 1B, FIG. 2, and FIG. 4, the first ground conductor 41 and the second ground conductor 42 are electrically connected to each other through the intermediate ground conductors 51 and 52 and the interlayer connection conductors (the first interlayer connection conductors VG11 to VG13 or the second interlayer connection conductors VG21 to VG23 shown in FIG. 2).

Further, in the line portion SL of the transmission line substrate 101, a transmission line of a strip line structure including the signal line 30A, the first ground conductor 41, the second ground conductor 42, the base material layer 12 interposed between the signal line 30A and the first ground conductor 41, and the base material layers 13 and 14 interposed between the signal line 30A and the second ground conductor 42 is provided.

As shown in FIG. 4, in the connecting portion CN2 of the transmission line substrate 101, the signal line 30A and the external electrode P12 face each other in a stacking direction (a Z-axis direction) in which the plurality of base material layers are stacked on each other, without interposing an interlayer connection conductor therebetween. Although not shown, in the connecting portion CN1, the signal line 30A and the external electrode P11 face each other in the Z-axis direction, without interposing an interlayer connection conductor therebetween. In addition, the signal line 30A according to the present preferred embodiment, as shown in FIG. 1B, FIG. 3B, and FIG. 4, is not connected (not electrically connected) to the interlayer connection conductor.

As shown in FIG. 2, the plurality of first interlayer connection conductors VG11 to VG13 provided at the line portion SL, when viewed in the Z-axis direction, are provided along the signal line 30A to surround the signal line 30A. The description of "the plurality of first interlayer connection conductors surround the signal line" refers to a state in which, when viewed in the Z-axis direction, the signal line partially overlaps a triangle defined by line segments connecting each of at least three of the first interlayer connection conductors.

In addition, as shown in FIG. 2 and FIG. 3A, the plurality of second interlayer connection conductors VG21 to VG23 (FIG. 2) provided at the connecting portions CN1 and CN2 (FIG. 2) are provided as follows. When viewed in the Z-axis direction, a portion in which the signal line 30A and the external electrode P11 face each other and a portion in which the signal line 30A and the external electrode P12 face each other each are defined as a facing portion. Each of the second interlayer connection conductors VG21 to VG23 surrounds the facing portion.

The description of "the plurality of second interlayer connection conductors surround the facing portion" refers to any one of the following cases i) to iii).

i) A state in which the second interlayer connection conductor, when viewed in the Z-axis direction, is provided in each of any three orthogonal directions with respect to the facing portion. For example, as shown in FIG. 3A, at least one second interlayer connection conductor (corresponding to the three second interlayer connection conductors VG21 provided on the right side of the facing portion and labeled with "A" in FIG. 3A) is provided in the positive X direction with respect to the facing portion (the right end of the signal line 30A), at least one second interlayer connection conductor (corresponding to the three second interlayer connection conductors VG21 provided on the upper side of the facing portion and labeled with "B" in FIG. 3A) is provided in the positive Y direction with respect to the facing portion, and at least one second interlayer connection conductor (corresponding to the three second interlayer connection conductors VG21 provided on the lower side of the facing portion and labeled with "C" in FIG. 3A) is provided in the negative Y direction with respect to the facing portion.

ii) A state in which the second interlayer connection conductor, when viewed in the Z-axis direction, is provided in each of at least three quadrants among four quadrants divided by two orthogonal lines (two straight lines extending in any direction) intersecting at the facing portion.

iii) A state in which at least a portion of the facing portion, when viewed in the Z-axis direction, overlaps a triangle defined by line segments connecting each of at least three of the second interlayer connection conductors.

In a case of i), when viewed in the Z-axis direction, the second interlayer connection conductor is preferably provided in each of any four orthogonal or substantially orthogonal directions with respect to the facing portion, for example. In addition, in a case of ii), when viewed in the Z-axis direction, the second interlayer connection conductor is preferably provided at all of the four quadrants divided by two orthogonal or substantially orthogonal lines (two straight lines extending in any direction) intersecting at the facing portion, for example. Further, in a case of iii), the entire or substantially the entire facing portion, when viewed in the Z-axis direction, preferably overlaps a triangle defined by line segments connecting each of at least three of the second interlayer connection conductors, for example.

In addition, the plurality of second interlayer connection conductors VG21 to VG23 provided at the connecting portions CN1 and CN2 are provided with a higher density than the plurality of first interlayer connection conductors VG11 to VG13 provided at the line portion SL. More specifically, as shown in FIG. 3A, an interval G2 of the plurality of second interlayer connection conductors VG21 to VG23 is smaller than an interval G1 of the plurality of first interlayer connection conductors VG11 to VG13 (G2<G1). In the present preferred embodiment, the interval G1 of the plurality of first interlayer connection conductors VG11 to VG13 is, for example, $\lambda/4$ ($\lambda$: a wavelength of a transmission signal) or less (G1≤$\lambda/4$). In addition, the interval G2 of the plurality of second interlayer connection conductors VG21 to VG23 is, for example, $\lambda/16$ or less (G2≤$\lambda/16$). Herein, the interval of the interlayer connection conductors corresponds to a distance connecting two interlayer connection conductors of which the interval is to be provided, by the shortest path.

Accordingly, among the connecting portions CN1 and CN2, the facing portion (a portion in which the signal line 30A and the external electrodes P11 and P12 face each other in the Z-axis direction) defines and functions as a waveguide WG extending in the Z-axis direction. In other words, in the transmission line substrate 101, in the connecting portions CN1 and CN2, the function of the facing portion is changed from the transmission line of a strip line structure to the waveguide WG. Therefore, even when the signal line 30A and the external electrodes P11 and P12 are not directly connected to each other, a high-frequency signal is transmitted by TE waves (H waves).

The transmission line substrate 101 according to the present preferred embodiment of the present invention is manufactured by, for example, the following non-limiting process.

(1) First, a plurality of base material layers 11, 12, 13, and 14 are prepared. The base material layers 11 to 14 are sheets primarily including a thermoplastic resin such as a liquid crystal polymer (LCP) or a polyether ether ketone (PEEK), for example.

(2) Subsequently, a signal line 30A, a first ground conductor 41, a second ground conductor 42, a plurality of intermediate ground conductors 51 and 52, and external electrodes P11 and P12 are formed on the plurality of base material layers 11 to 14. Specifically, metal foil (Cu foil, for example) is laminated on a front surface of the base material layers 11 to 14, and the metal foil is patterned by photolithography, for example. As a result, the first ground conductor 41 is formed on the front surface of the base material layer 11, the signal line 30A and the plurality of intermediate ground conductors 51 are formed on a front surface of the base material layer 12, the plurality of intermediate ground conductors 52 are formed on a front surface of the base material layer 13, and the external electrodes P11 and P12 and the second ground conductor 42 are formed on a front surface of the base material layer 14.

(3) In addition, a plurality of first interlayer connection conductors and a plurality of second interlayer connection conductors are formed in the base material layers 12 to 14, respectively. The interlayer connection conductors are provided by providing a hole (a through hole) in each of the plurality of base material layers 12 to 14, providing (filling) the hole with a conductive bonding material including metal powder including, for example, Cu and Sn or an alloy including Cu and Sn, and a resin material, and then solidifying the conductive bonding material by the subsequent heating and pressing process.

(4) Subsequently, the plurality of base material layers 11, 12, 13 and 14 are stacked on each other in this order, and the stacked base material layers 11 to 14 are heated and pressed (collectively pressed) to form a stacked body.

(5) Thereafter, a protective layer 1 is formed on a front surface (a surface of the base material layer 14) of the stacked body, and a transmission line substrate 101 (a base material 10A) is provided. The protective layer 1 may be a coverlay film, a solder resist film, or an epoxy resin film, for example.

According to the above manufacturing method, since the base material 10A is able to be easily formed by stacking, and heating and pressing (collectively pressing) the plurality of base material layers 11 to 14 that primarily include a thermoplastic resin, the number of manufacturing steps is reduced, which reduces a manufacturing cost.

In addition, according to the above manufacturing method, since a conductive bonding material (conductive paste) is provided in a hole in the plurality of base material layers and the conductive bonding material is able to be solidified by the heating and pressing (collectively pressing), the number of steps of manufacturing an interlayer connection conductor is able to be reduced.

Figure 5:
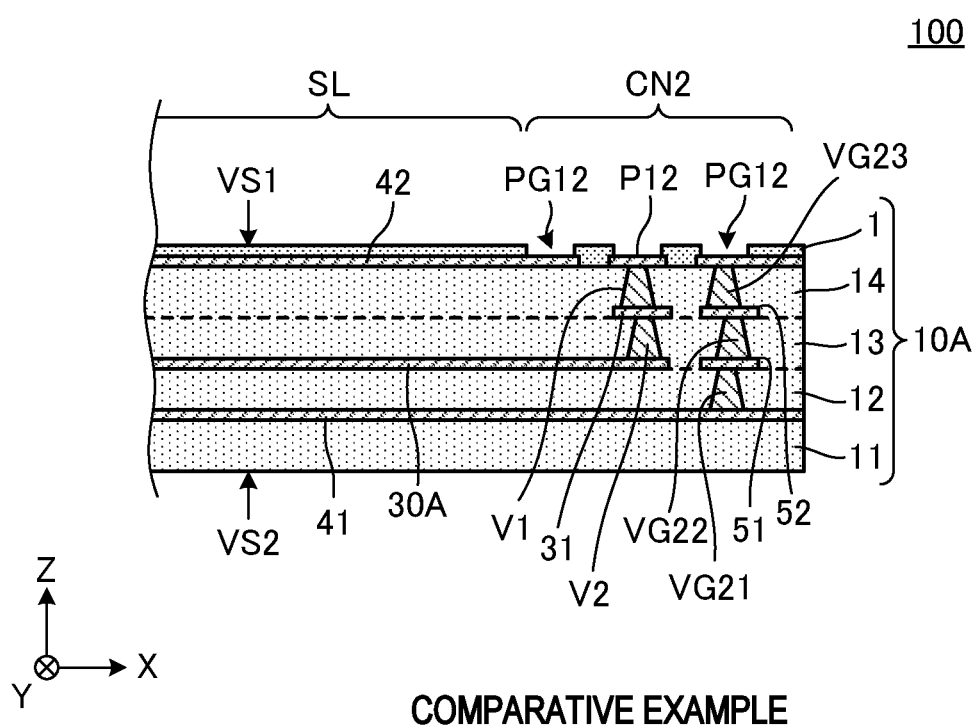
FIG. 5 is a cross-sectional view near a connecting portion of a transmission line substrate as a comparative example.

Next, advantages of the structure in which the facing portion (a portion in which the signal line 30A and the external electrodes P11 and P12 face each other in the Z-axis direction) surrounded by the plurality of second interlayer connection conductors VG21 to VG23 defines and functions as a waveguide WG will be described with reference to a comparative example. FIG. 5 is a cross-sectional view near a connecting portion CN2 of a transmission line substrate 100 as a comparative example.

The transmission line substrate 100 as a comparative example is different from the transmission line substrate 101 in that interlayer connection conductors V1 and V2 and a signal conductor 31 are further provided. Other features of the transmission line substrate 100 are the same or substantially the same as the features of the transmission line substrate 101.

In the connecting portion CN2 of the transmission line substrate 100, the signal line 30A provided in the base material 10A and the external electrode P12 provided on a first main surface VS1 of the base material 10A are connected to each other through the interlayer connection conductors V1 and V2 and the signal conductor 31. Although not shown, the connecting portion CN1 of the transmission line substrate 100 also has the same or substantially the same features.

As shown in FIG. 5, in a case in which the signal line 30A and the external electrode P12 are connected to each other through the interlayer connection conductors V1 and V2, due to a positional shift when the base material 10A is formed (when the plurality of base material layers 11 to 14 are stacked), a variation in a positional relationship of the signal line 30A, the plurality of interlayer connection conductors V1 and V2, and the external electrode 12 may occur. Therefore, return loss may occur between the signal line 30A and the external electrode P12 (at a portion of the transmission path drawn out to a surface of the transmission line substrate). Particularly, in the present preferred embodiment, two or more interlayer connection conductors connect the signal line 30A and the external electrodes P12, and, in comparison with a case of one interlayer connection conductor, return loss easily occurs.

In contrast, in the present preferred embodiment, in the connecting portions CN1 and CN2, the facing portion of the signal line 30A and the external electrodes P11 and P12 defines and functions as a waveguide WG extending in the Z-axis direction. Accordingly, a signal is able to be transmitted between the signal line 30A and the external electrodes P11 and P12 without directly connecting the signal line 30A and the external electrodes P11 and P12 (without interposing an interlayer connection conductor therebetween). Therefore, the occurrence of return loss with a positional shift when the base material 10A is formed is able to be reduced.

Figure 6:
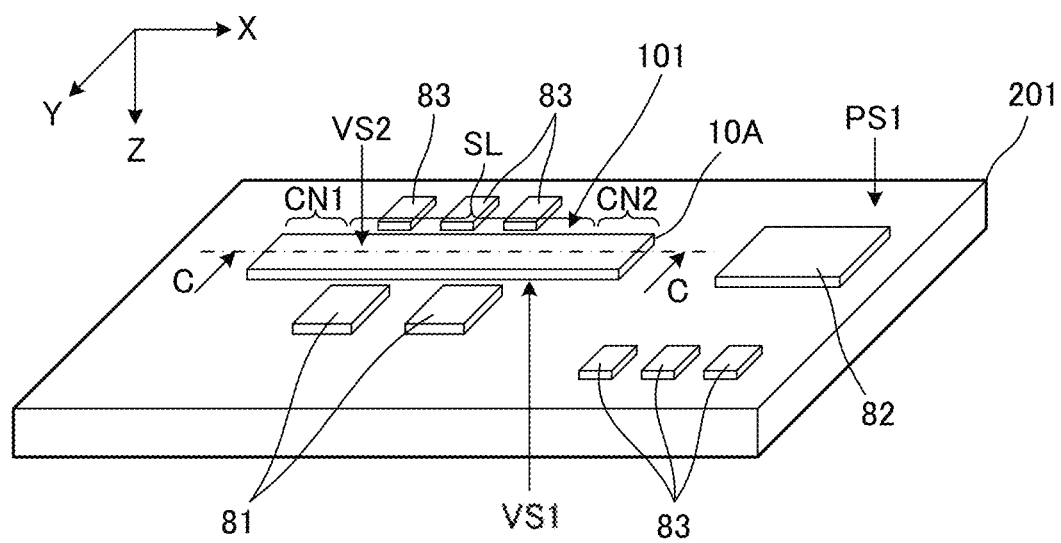
FIG. 6 is a perspective view showing a main portion of an electronic device according to the first preferred embodiment of the present invention.
Figure 7:
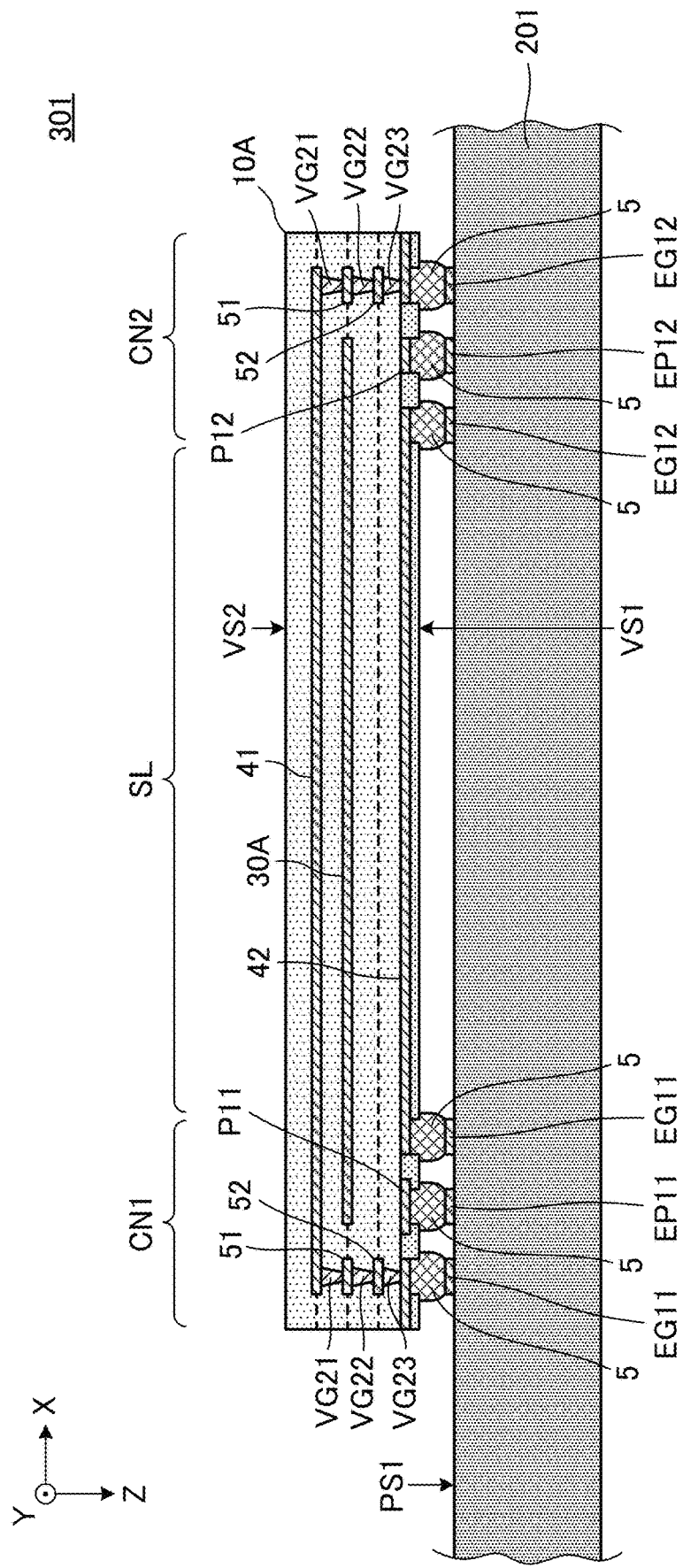
FIG. 7 is a cross-sectional view taken along line C-C in FIG. 6.

The transmission line substrate 101 is used as follows, for example. FIG. 6 is a perspective view showing a main portion of an electronic device 301 according to the first preferred embodiment. FIG. 7 is a cross-sectional view taken along line C-C in FIG. 6.

The electronic device 301 includes a transmission line substrate 101, a circuit substrate 201, and components 81, 82, and 83. The electronic device 301 also includes components other than the components described above, which are not shown in FIG. 6. The circuit substrate 201 may be a glass epoxy substrate, for example. The components 81 to 83 may be, for example, chip components such as chip inductors or chip capacitors, RFIC elements, or impedance matching circuits.

The circuit substrate 201 is an example of a "different substrate".

The circuit substrate 201 includes a main surface PS1. As shown in FIG. 7, substrate electrodes EP11 and EP12, substrate ground electrodes EG11 and EG12, and the like are provided on the main surface PS1 of the circuit substrate 201.

The transmission line substrate 101 is mounted to the circuit substrate 201 by a conductive bonding material. Specifically, the external electrodes P11 and P12 of the transmission line substrate 101 are respectively bonded to the substrate electrodes EP11 and EP12 of the circuit substrate 201 by a conductive bonding material 5, for example, solder. In addition, as shown in FIGS. 1B and 7, the ground electrodes PG11 and PG12 of the transmission line substrate 101 (FIG. 1B) are respectively bonded to the substrate ground electrode EG11 and EG12 of the circuit substrate 201 (FIG. 7) through the conductive bonding material 5 (FIG. 7). The components 81 to 83 are also bonded to the circuit substrate 201 through the conductive bonding material, which is not shown.

Accordingly, the transmission line substrate 101, while the first main surface VS1 faces the main surface PS1 of the circuit substrate 201, is mounted to the circuit substrate 201.

Figure 8:
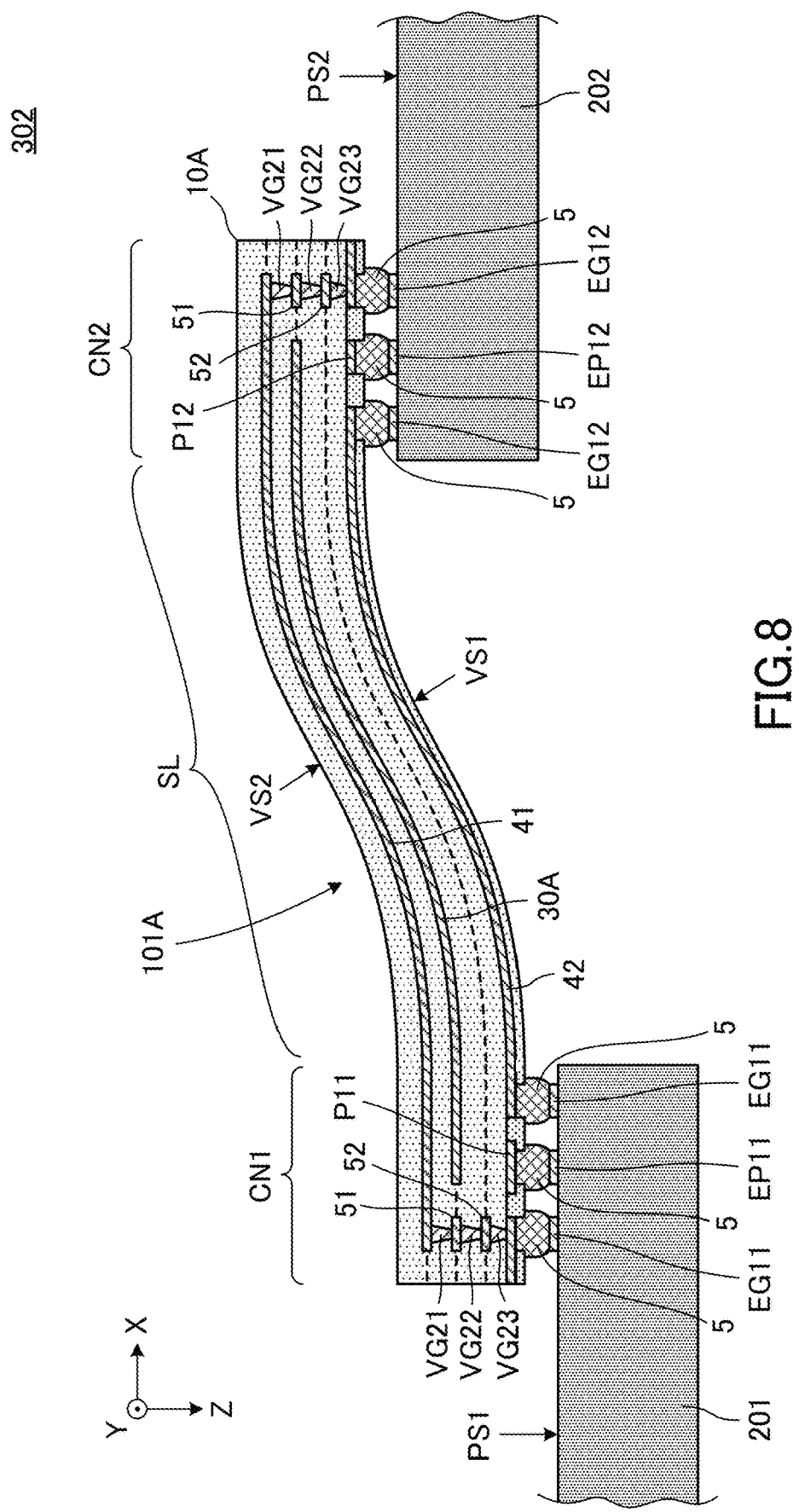
FIG. 8 is a perspective view showing a main portion of another electronic device according to the first preferred embodiment of the present invention.

The transmission line substrate 101 may be used as follows. FIG. 8 is a perspective view showing a main portion of another electronic device 302 according to the first preferred embodiment.

The electronic device 302 includes the transmission line substrate 101A and the circuit substrates 201 and 202. The circuit substrate 202 includes a main surface PS2. As shown in FIG. 8, the main surface PS1 of the circuit substrate 201 and the main surface PS2 of the circuit substrate 202 are provided at different heights in the Z-axis direction. The circuit substrate 202 is also an example of the "different substrate".

The substrate electrode EP11 and the substrate ground electrode EG11 are provided on the main surface PS1 of the circuit substrate 201. The substrate electrodes EP12 and EG12 are provided on the main surface PS2 of the circuit substrate 202.

As shown in FIG. 8, the transmission line substrate 101A, while the line portion SL is bent, is mounted to each of the circuit substrates 201 and 202. Specifically, as shown in FIGS. 1B and 8, the external electrode P11 and the ground electrode PG11 (FIG. 1B) of the transmission line substrate 101A are respectively bonded to the substrate electrode EP11 and the substrate ground electrode EG11 of the circuit substrate 201 through the conductive bonding material 5 (FIG. 8). In addition, as shown in FIGS. 1B and 8, the external electrode P12 and the ground electrode PG12 (FIG. 1B) of the transmission line substrate 101A are respectively bonded to the substrate electrode EP12 and the substrate ground electrode EG12 of the circuit substrate 202 through the conductive bonding material 5 (FIG. 8).

Accordingly, the transmission line substrate 101A of the electronic device 302, since the line portion SL is bent, is easier to be mounted to the circuit substrates 201 and 202 including the main surfaces PS1 and PS2 provided at different heights in the Z-axis direction.

According to the transmission line substrate 101 and the electronic device 301 of the present preferred embodiment, the following advantageous effects in addition to the above described advantageous effects are provided.

(a) In the present preferred embodiment, the interlayer connection conductor is not connected (not electrically connected) to the signal line 30A. Accordingly, the return loss resulting from a positional shift of the plurality of base material layers 11 to 14 when the base material 10A, as shown in FIG. 1B, is formed (when the plurality of base material layers 11 to 14 are stacked) is able to be effectively reduced or prevented. In addition, in comparison with a case in which the signal line 30A and the external electrodes P11 and P12 are connected to each other through the interlayer connection conductor, conductor loss between the external electrodes P11 and P12 (transmission paths) is able to be significantly reduced or prevented.

While the transmission line substrate 101 according to the present preferred embodiment shows an example in which the signal line 30A is not connected to the interlayer connection conductor, the present invention is not limited to this specific structure. In the connecting portions CN1 and CN2, as long as a waveguide WG extending in the Z-axis direction is provided in at least a portion between the signal line 30A and the external electrodes P11 and P12, the signal line 30A may be connected (electrically connected) to the interlayer connection conductor. However, the signal line 30A is preferably not connected (not electrically connected) to the interlayer connection conductor, for example, to significantly reduce or prevent the occurrence of return loss with the positional shift of the plurality of base material layers.

(b) In the present preferred embodiment, the plurality of first interlayer connection conductors VG11 to VG13 provided at the line portion SL, when viewed in the Z-axis direction, are provided along the signal line 30A to surround the signal line 30A. Accordingly, unnecessary radiation from a side of the line portion SL in the Y-axis direction is able to be significantly reduced or prevented.

(c) In addition, in the present preferred embodiment, the plurality of second interlayer connection conductors VG21, VG22, and VG23 provided at the connecting portions CN1 and CN2 are provided with a higher density than the plurality of first interlayer connection conductors VG11 to VG13 provided at the line portion SL. Accordingly, the effect of noise from the outside to the facing portion of the signal line 30A and the external electrodes P11 and P12 in the connecting portions CN1 and CN2 is able to be significantly reduced or prevented. In addition, the mechanical strength and the durability against an external force of the connecting portions CN1 and CN2 are able to be relatively increased. Therefore, deformation or the like of the connecting portions CN1 and CN2 when the transmission line substrate 101 is mounted to the circuit substrate 201 is significantly reduced or prevented, and failure of mounting the transmission line substrate 101 to the circuit substrate 201 or failure of mounting other components or elements to the transmission line substrate 101 is significantly reduced or prevented. Further, the density of the first interlayer connection conductors VG11 to VG13 provided at the line portion SL is low, and, in a case in which the base material 10A includes a material with flexibility, the flexibility of the line portion SL is able to be increased, and the line portion SL is able to be more easily bent (see the transmission line substrate 101A in FIG. 8). Furthermore, in comparison with a case in which the first interlayer connection conductors VG11 to VG13 are provided at the line portion SL with a high density, the number of interlayer connection conductors of the entire transmission line substrate 101 is able to be reduced, and thus the number of holes to be provided in a base material layer and the steps to fill the holes with a conductive bonding material are able to be reduced. Therefore, time to perform steps to form an interlayer connection conductor is able to be reduced.

As with the transmission line substrate 101 according to the present preferred embodiment, the interval of the plurality of second interlayer connection conductors VG21 to VG23 is preferably about λ/16 or less, for example, to significantly reduce or prevent the effect of noise from the outside to the connecting portions CN1 and CN2, or to significantly reduce or prevent the unnecessary radiation from the connecting portions CN1 and CN2.

In addition, even when the plurality of second interlayer connection conductors VG21 to VG23 being grounds are provided at the connecting portions CN1 and CN2 at a small interval, external noise may be propagated (entered) from the interval of the plurality of second interlayer connection conductors VG21 to VG23. In contrast, in the facing portion of the connecting portions CN1 and CN2 of the transmission line substrate 101, a mode is changed to the mode of the waveguide WG, and the waveguide WG defines and functions as a high-pass filter. Therefore, it is unlikely to be affected by low frequency noise (noise below a cut-off frequency).

(d) In addition, in the present preferred embodiment, the plurality of ground electrodes (first ground electrodes) PG11 provided at the connecting portion CN1, when viewed in the Z-axis direction, are provided at a position to surround the external electrode (a first external electrode) P11. Further, the plurality of ground electrodes (first ground electrodes) PG12 provided at the connecting portion CN2, when viewed in the Z-axis direction, are provided at a position to surround the external electrode (a first external electrode) P12. Accordingly, the connecting portions CN1 and CN2 of the transmission line substrate 101 are able to be mounted on the circuit substrate 201 or the like with high positional accuracy. Specifically, the mounting positions of the connecting portions CN1 and CN2 are corrected by a self-alignment function of the plurality of ground electrodes and the substrate electrodes on a different substrate or the like, during a reflow process. As a result, bonding failure between the external electrodes P11 and P12 and the substrate electrodes EP11 and EP12 that is caused by a positional shift is significantly reduced or prevented.

In addition, the plurality of ground electrodes PG11 surround the external electrode P11, and the unnecessary radiation from a bonding portion in which the external electrode P11 and the substrate electrode EP11 are bonded through the conductive bonding material 5 is significantly reduced or prevented. Further, damage of the bonding portion of the external electrode P11 and the substrate electrode EP11 due to bending stress to be generated when the base material 10A is bent or the like is significantly reduced or prevented. The same also applies to a bonding portion of the external electrode P12 and the substrate electrode EP12.

The "connecting portion" refers to a portion in which the external electrode of the transmission line substrate or the like is bonded to another substrate (a circuit substrate, another transmission line substrate, or the like), that is, a portion in which a signal is transmitted to another substrate. The "line portion" refers to a portion (see the third preferred embodiment) of which the width is larger than other portions, for example, because a large number of second interlayer connection conductors are included. In addition, when viewed in the Z-axis direction, the entire or substantially the entire region including a portion that defines and functions as the waveguide WG, and a portion in which the plurality of interlayer connection conductors are provided at a smaller interval than an interval of other portions may be defined as the "line portion".

In the transmission line substrate, the plurality of interlayer connection conductors (first interlayer connection conductors) do not need to be provided at the line portion SL. The line portion SL is able to be more easily bent in a case in which the plurality of first interlayer connection conductors are not provided at the line portion SL. In contrast, as with the transmission line substrate 101, the plurality of first interlayer connection conductors are provided at the line portion SL, and coupling with a component or the like that is located adjacent to or in a vicinity of to the line portion SL is able to be significantly reduced or prevented.

Second Preferred Embodiment

In a second preferred embodiment of the present invention, an example of a transmission line substrate of which the shapes of a signal line and an intermediate ground conductor are different from the shapes described in the first preferred embodiment will be described.

Figure 9:
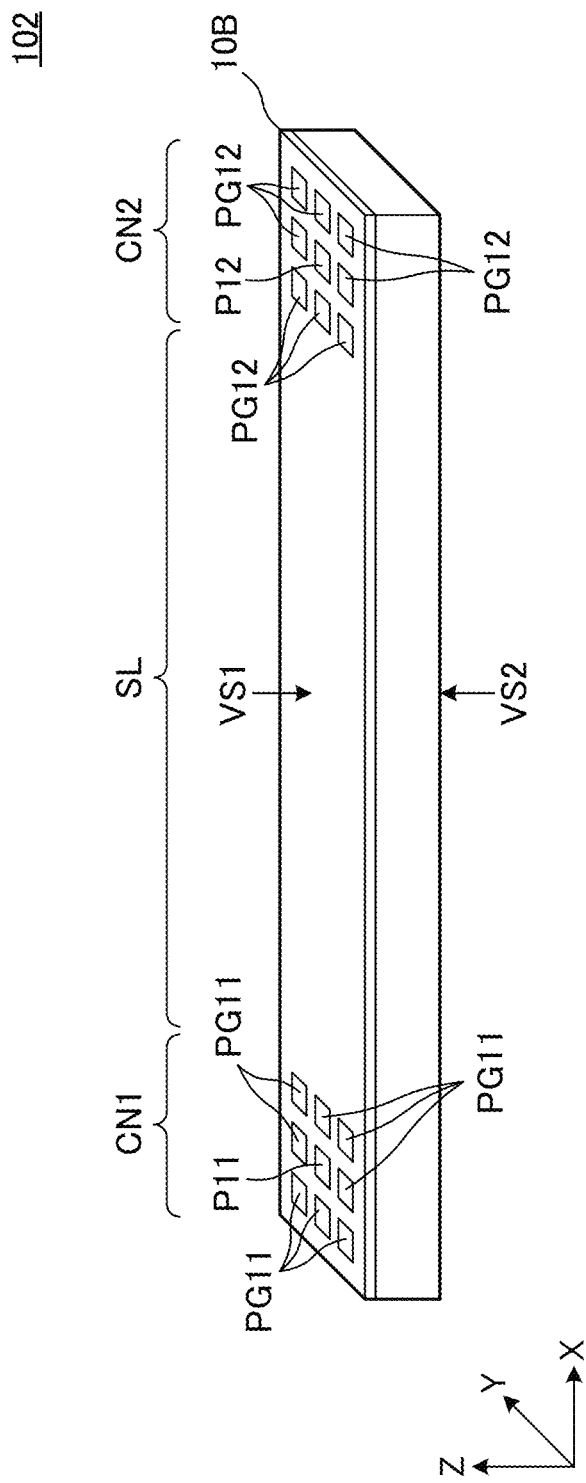
FIG. 9 is an external perspective view of a transmission line substrate according to a second preferred embodiment of the present invention.
Figure 10:
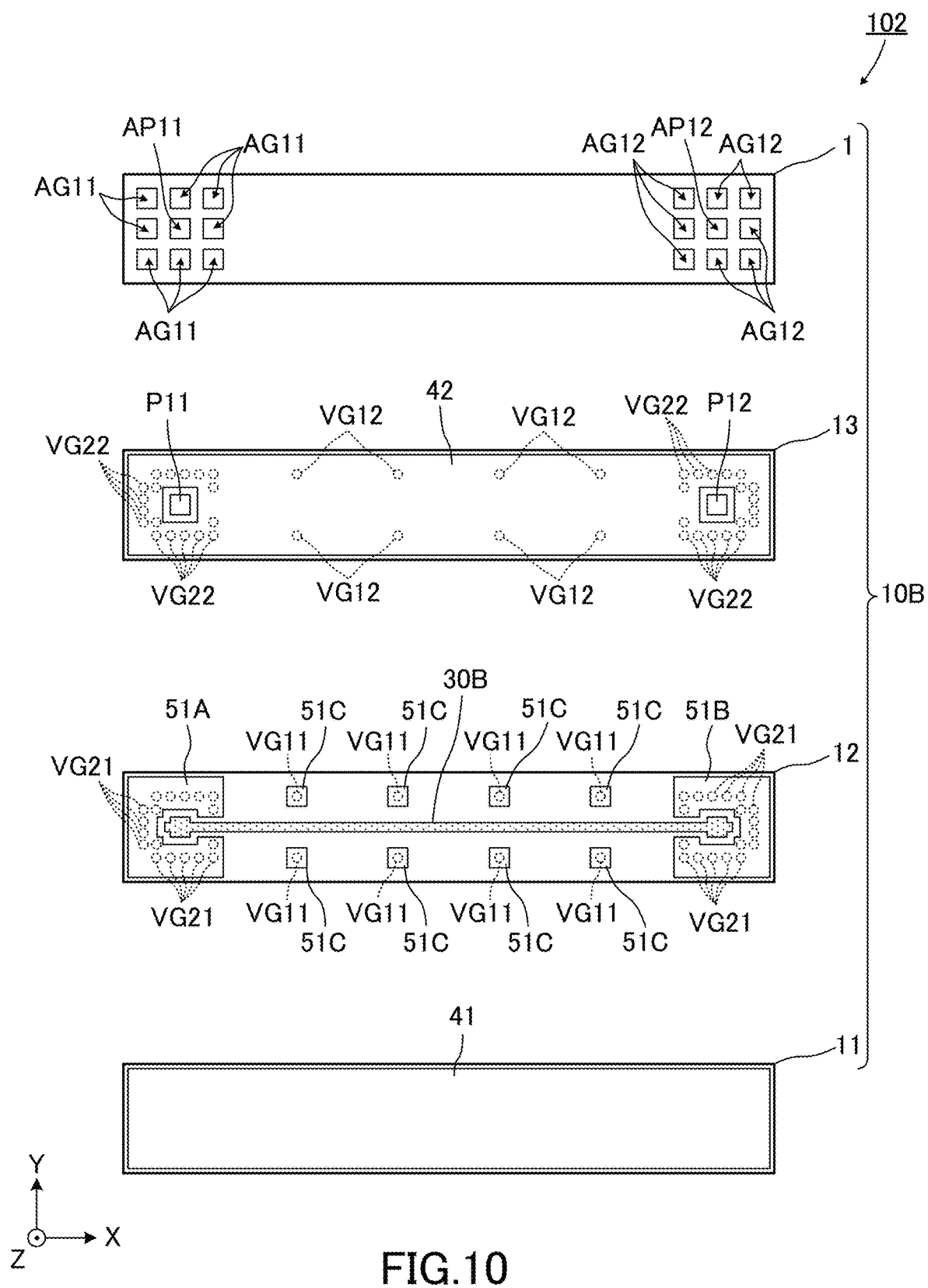
FIG. 10 is an exploded plan view of the transmission line substrate.
Figure 11:
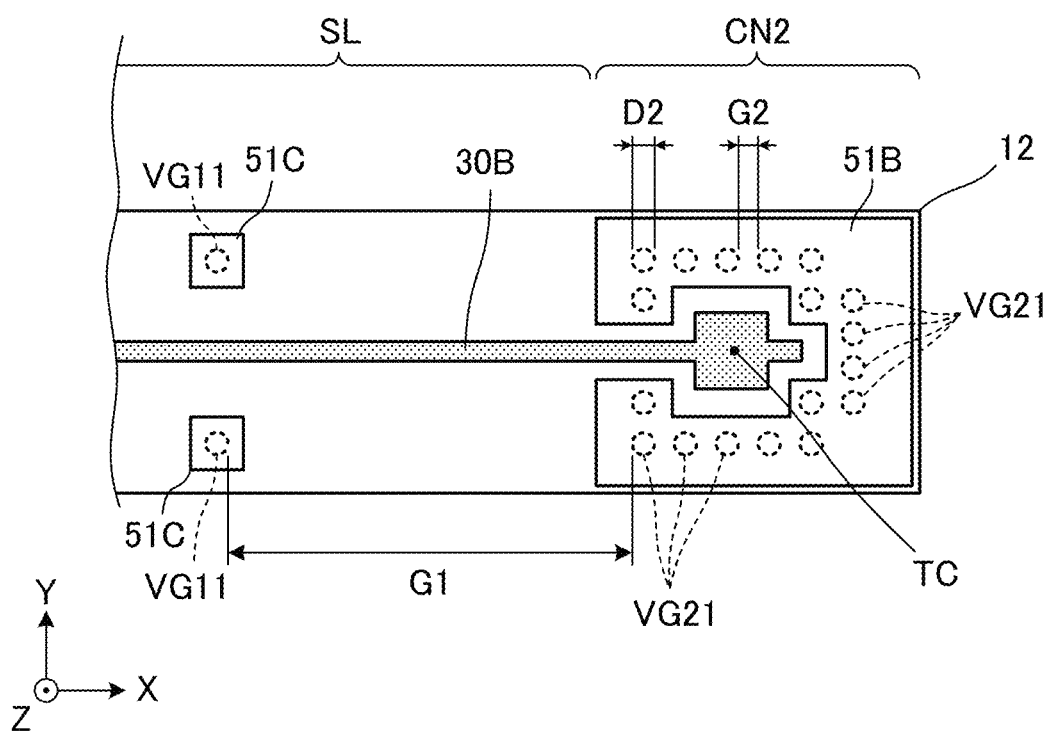
FIG. 11 is an enlarged plan view of a base material layer near a connecting portion of the transmission line substrate.

FIG. 9 is an external perspective view of a transmission line substrate 102 according to the second preferred embodiment of the present invention. FIG. 10 is an exploded plan view of the transmission line substrate 102. FIG. 11 is an enlarged plan view of a base material layer 12 near a connecting portion CN2 of the transmission line substrate 102. In FIG. 10 and FIG. 11, a signal line 30B is shown by a dot pattern to clarify the structure.

The transmission line substrate 102 is different from the transmission line substrate 101 according to the first preferred embodiment in that a base material 10B is provided. In addition, the transmission line substrate 102 is different from the transmission line substrate 101 in that, when viewed in the Z-axis direction, intermediate ground conductors 51A and 51B are provided over the entire or substantially the entire surface of the connecting portions CN1 and CN2. Other features of the transmission line substrate 102 are the same or substantially the same as the features of the transmission line substrate 101.

Hereinafter, the differences from the transmission line substrate 101 according to the first preferred embodiment will be described.

The base material 10B is provided by stacking a plurality of base material layers 11, 12, and 13, and a protective layer 1 in this order. The base material layers 11 to 13 and the protective layer 1 are the same or substantially the same as the base material layers and the protective layer that are described in the first preferred embodiment.

A first ground conductor 41 is provided on a front surface of the base material layer 11. The first ground conductor 41 is the same or substantially the same as the ground conductor described in the first preferred embodiment.

A signal line 30B and intermediate ground conductors 51A, 51B, and 51C are provided on a front surface of the base material layer 12. The signal line 30B is a linear conductor pattern extending in a transmission direction (the X-axis direction). The signal line 30B includes a wide portion of which the line width (the width in the Y-axis direction) is larger than other portions near a first end (a left end of the signal line 30B in FIG. 10). In addition, the signal line 30B includes a wide portion near a second end (a right end of the signal line 30B in FIG. 10 and FIG. 11). As will be described herein, the wide portions are facing portions that face the external electrode (P11, P12) in the Z-axis direction.

The intermediate ground conductors 51A, 51B, and 51C, when viewed in the Z-axis direction, are rectangular or substantially rectangular conductor patterns each surrounding the signal line 30B. The intermediate ground conductor 51A is provided over substantially the entire surface of a first end of the base material layer 12, and the intermediate ground conductor 51B is provided over substantially the entire surface of a second end of the base material layer 12. The intermediate ground conductor 51C is located near a center of the longitudinal direction of the base material layer 12, and is provided along the signal line 30B.

In addition, a plurality of first interlayer connection conductors VG11 and a plurality of second interlayer connection conductors VG21 are provided in the base material layer 12.

The external electrodes P11 and P12 and the second ground conductor 42 are provided on a front surface of the base material layer 13. The external electrodes P11 and P12 and the second ground conductor 42 are the same as the external electrode and the second ground conductor that are described in the first preferred embodiment. In addition, a plurality of first interlayer connection conductors VG12 and a plurality of second interlayer connection conductors VG22 are provided in the base material layer 13.

The plurality of second interlayer connection conductors VG21 and VG22 are a series of interlayer connection conductors surrounding the facing portion (a portion in which the wide portion of the signal line 30B and the external electrodes P11 and P12 face each other). The "series" as used herein refers to an arrangement in a row to surround the facing portion along the outer shape of the facing portion when viewed in the Z-axis direction.

In the present preferred embodiment, a total value represented by TD2 of a diameter D2 of the series of second interlayer connection conductors VG21 and VG22 is larger than a total value represented by TG2 of an interval G2 of the series of second interlayer connection conductors VG21 and VG22 (TD2>TG2). The diameter D2 corresponds to a "length of a line segment that connects a series of second interlayer connection conductors traverses the second interlayer connection conductors", and the interval G2 corresponds to an "interval of the second interlayer connection conductors on a line segment that connects a series of second interlayer connection conductors."

Figure 12A:
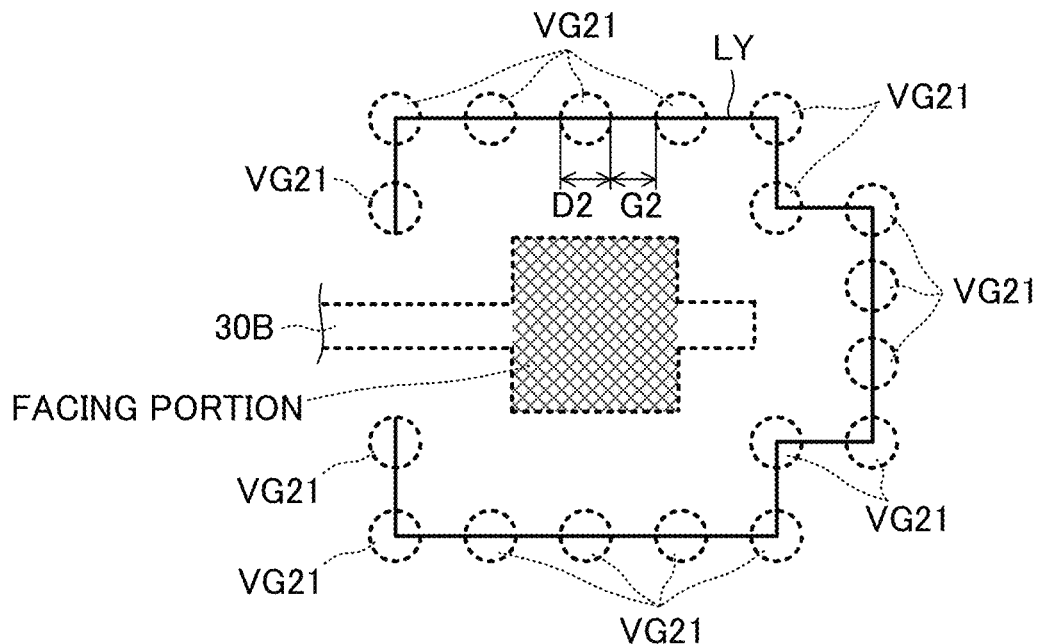
FIGS. 12A and 12B are views showing a relationship between interlayer connection conductors and an interval between the interlayer connection conductors.
Figure 12B:
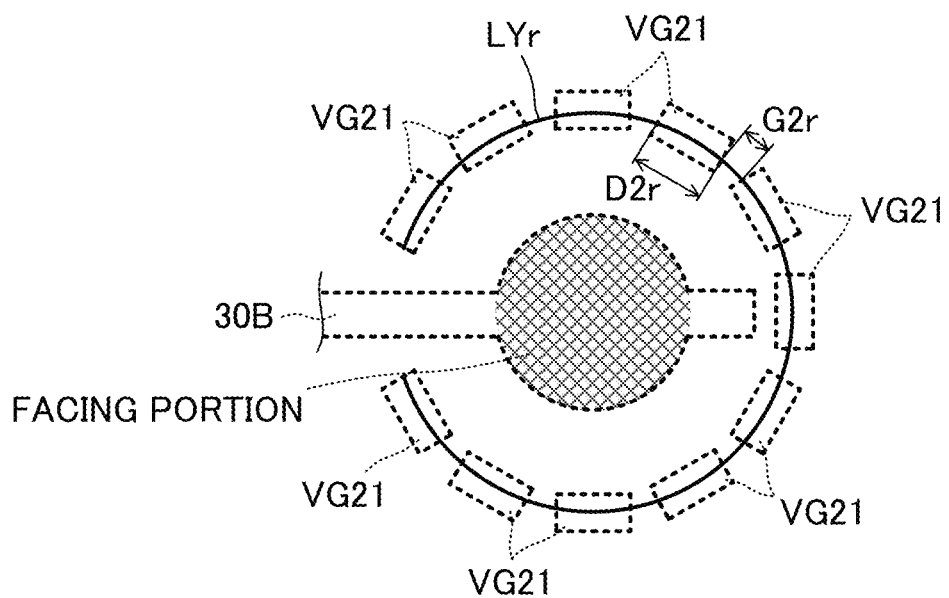

The above features are also able to be implemented in a structure described below. FIGS. 12A and 12B are views showing a relationship between interlayer connection conductors and an interval between the interlayer connection conductors.

In FIG. 12A, the planar shape of the second interlayer connection conductor VG21 is circular or substantially circular, and the arrangement of the second interlayer connection conductors VG21 shows a case of a bent straight line. Accordingly, a length of a line segment LY that connects the center of each of the series of second interlayer connection conductors VG21 in the shortest to surround the facing portion traverses the second interlayer connection conductors VG21 defines the diameter D2. In addition, a distance between the second interlayer connection conductors VG21 adjacent to each other on the line segment LY defines the interval G2.

In FIG. 12B, the planar shape of the second interlayer connection conductor VG21 is rectangular or substantially rectangular, and the arrangement of the second interlayer connection conductors VG21 shows a case of a circle.

Accordingly, a length of a line segment LYr of a circle (an arc) that passes the center of each of the series of second interlayer connection conductors VG21 to surround the facing portion traverses the second interlayer connection conductors VG21 defines a transverse distance D2r. The transverse distance D2r corresponds to a "length of a line segment that connects a series of second interlayer connection conductors traverses the second interlayer connection conductors". In addition, a distance between the second interlayer connection conductors VG21 adjacent to each other on the line segment LYr defines the interval G2r. The interval G2r corresponds to an "interval of the second interlayer connection conductors on a line segment that connects a series of second interlayer connection conductors." Accordingly, the total value of the transverse distance D2r may be larger than the total value of the interval G2r.

In addition, the concept is applicable even when the shape of the second interlayer connection conductors VG21 is not uniform and the interval is not uniform. In each of the above cases, the shape of the interlayer connection conductor is not limited to a circle, and may be an ellipse, a rectangle, or the like. When a definition is given individually to each case, in a case of an ellipse, the diameter of the circle corresponds to a major axis, and in a case of a rectangle, the diameter of the circle corresponds to a length of a diagonal line. In contrast, in a case of a definition to the series of second interlayer connection conductors, the definition does not depend on the shape of the interlayer connection conductor, and the above described relationship is defined by a length that the series of line segments transverse the second interlayer connection conductors.

In addition, in the present preferred embodiment, the wide portion (the center TC of the wide portion, as shown in FIG. 11) of the signal line 30B is provided at a position (a position about λ/4 away from an end of the signal line 30B in the transmission direction, for example) away from the second end (the right end of the signal line 30B in FIG. 11) of the signal line 30B.

According to the present preferred embodiment, the following advantageous effects in addition to the advantageous effects described in the first preferred embodiment are provided.

(a) In the present preferred embodiment, the total value represented by TD2 of the diameter D2 of the series of second interlayer connection conductors VG21 and VG22 is larger than the total value represented by TG2 of the interval G2 of the series of second interlayer connection conductors VG21 and VG22 (TD2>TG2). Accordingly, the facing portion of the signal line 30B and the external electrodes in the connecting portions CN1 and CN2 is surrounded by the plurality of second interlayer connection conductors (the grounds) VG21 and VG22 provided with a high density, and the effect of noise from the outside to the facing portion is able to be further reduced or prevented. In addition, the unnecessary radiation from the connecting portions CN1 and CN2 is able to be further reduced or prevented.

(b) Further, in the present preferred embodiment, the wide portion is provided at a position away from the end (the left end and right end of the signal line 30B in FIG. 11) in the transmission direction of the signal line 30B. Accordingly, the mode of the transmission line is able to be easily changed to the mode of the waveguide WG.

Figure 13:
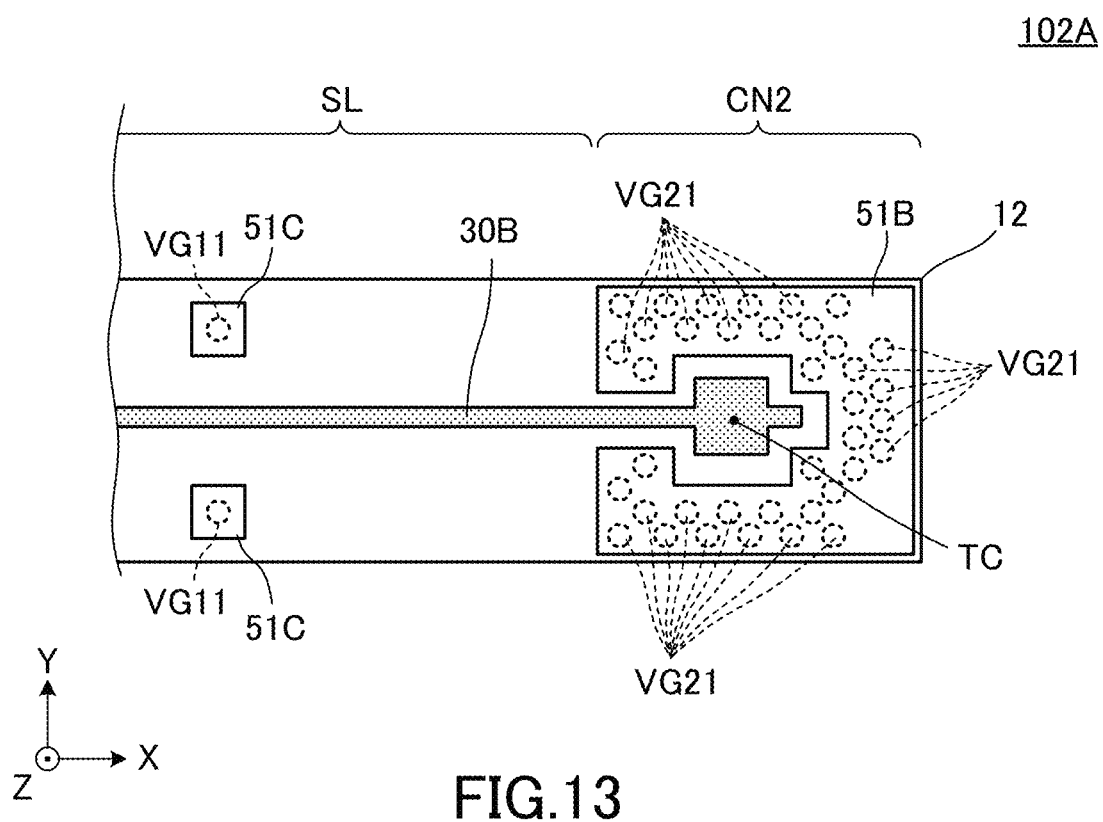
FIG. 13 is an enlarged plan view of a base material layer near a connecting portion of a transmission line substrate as a modification of the second preferred embodiment of the present invention.

Subsequently, a modification of a transmission line substrate 102 according to the second preferred embodiment of the present invention will be described. FIG. 13 is an enlarged plan view of a base material layer 12 near a connecting portion CN2 of a transmission line substrate 102A as a modification of the second preferred embodiment.

As shown in FIG. 13, in the transmission line substrate 102A, a plurality of second interlayer connection conductors VG21 and VG22, when viewed in the Z-axis direction, are provided in a staggered pattern to fill a gap. Although not shown, the plurality of second interlayer connection conductors VG21 and VG22 provided in the connecting portion CN1 of the transmission line substrate 102A have the same or substantially the same features. Accordingly, in comparison with a case (see the transmission line substrate 102) in which the plurality of second interlayer connection conductors VG21 and VG22 provided in the connecting portions CN1 and CN2 are not provided in a staggered pattern, the shielding property of the connecting portions CN1 and CN2 by the plurality of second interlayer connection conductor VG21 and VG22 is further increased, and, as a result, transmission loss is further significantly reduced or prevented.

Figure 14A:
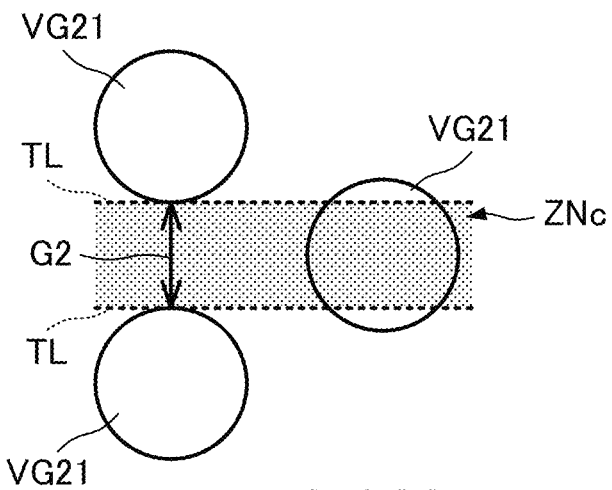
FIGS. 14A to 14C are views illustrating a definition of an arrangement in a staggered pattern.
Figure 14B:
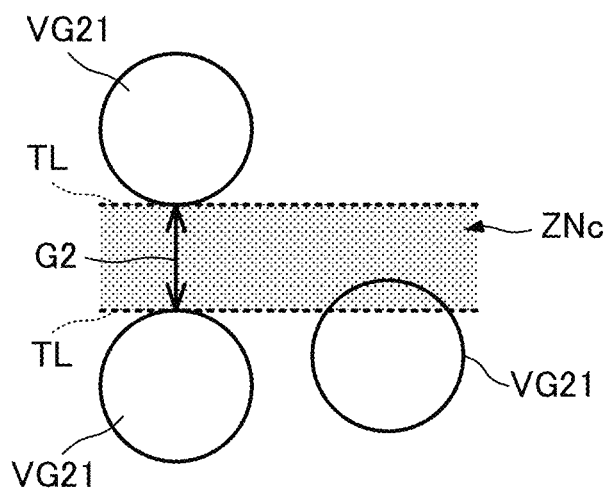
Figure 14C:
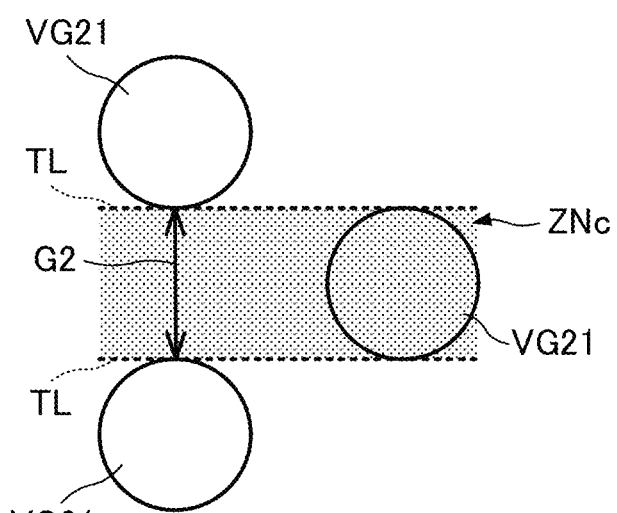

An arrangement in a staggered pattern may be defined by the arrangement of the second interlayer connection conductors as shown in FIGS. 14A to 14C, for example. FIGS. 14A to 14C are views illustrating a definition of an arrangement in a staggered pattern. As shown in FIGS. 14A to 14C, a tangent line TL of each of the second interlayer connection conductors VG21 is defined with respect to the line segment of the interval G2 being the shortest distance in an arrangement direction of adjacent second interlayer connection conductors VG21. A region ZNc interposed between the tangent lines TL is defined in a direction of the interval G2. A state in which different second interlayer connection conductors VG21 other than two second interlayer connection conductors VG21 that define the region ZNc overlap at least the region ZNc defines the arrangement in a staggered pattern.

For example, in FIG. 14A, one second interlayer connection conductor VG21 is provided over the region ZNc. In FIG. 14B, one second interlayer connection conductor VG21 partially overlaps the region ZNc. In FIG. 14C, one second interlayer connection conductor VG21 is entirely included in the region ZNc.

The features shown in FIG. 14A are able to close the interval of two adjacent second interlayer connection conductors when viewed from a side. In addition, the features shown in FIG. 14C are able to close at least a portion of the interval of two adjacent second interlayer connection conductors when viewed from a side while the entire area in which the second interlayer connection conductors are provided is reduced. In addition, the features shown in FIG. 14B are able to close at least a portion of the interval of two adjacent second interlayer connection conductors when viewed from a side.

Further, in the connecting portions CN1 and CN2 of the transmission line substrate 102A in which the plurality of second interlayer connection conductors VG21 and VG22 are provided in a staggered pattern, the plurality of second interlayer connection conductors VG21 and VG22 are able to be provided with further higher density than the connecting portions CN1 and CN2 of the transmission line substrate 102. As a result, the mechanical strength of the connecting portions CN1 and CN2 is further increased, and the deformation of the connecting portions CN1 and CN2 is further reduced or prevented. In addition, as a result, the shielding property of the connecting portions CN1 and CN2 is further increased.

Third Preferred Embodiment

In a third preferred embodiment of the present invention (shown in FIGS. 15-22B), an example in which one transmission line substrate is provided by bonding a plurality of transmission line substrates will be described.

Figure 15:
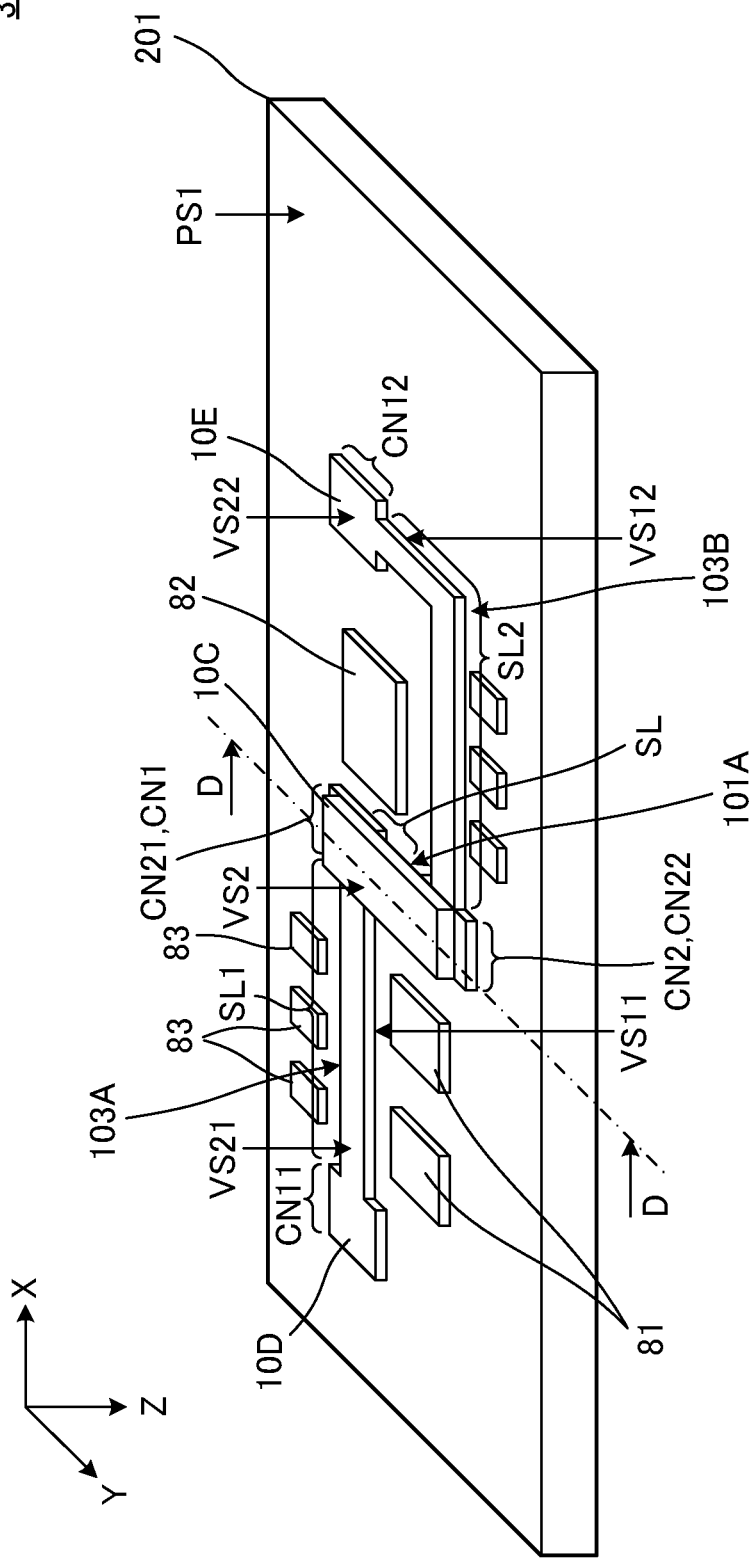
FIG. 15 is a perspective view showing a main portion of an electronic device according to a third preferred embodiment of the present invention.
Figure 16:
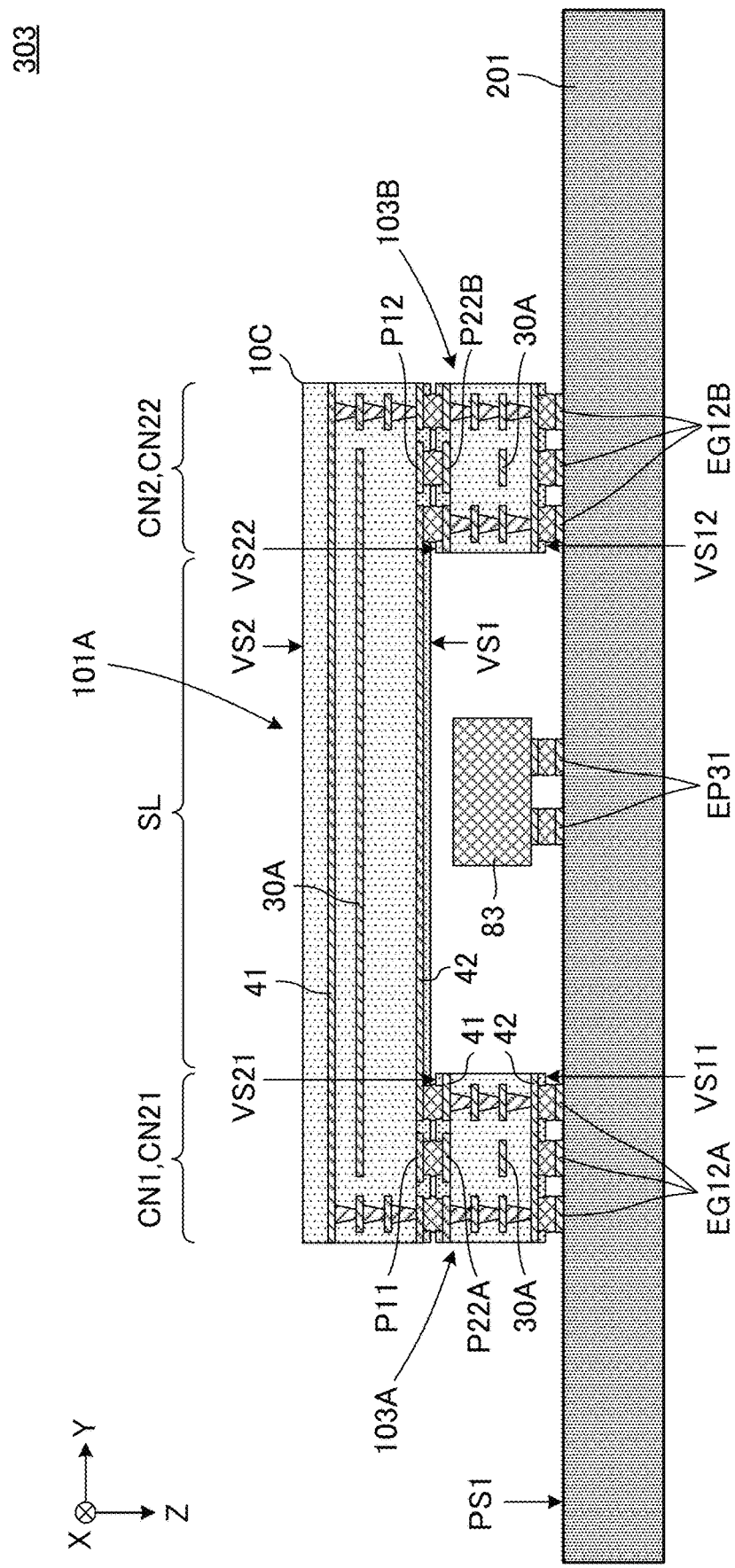
FIG. 16 is a cross-sectional view taken along line D-D in FIG. 15.

FIG. 15 is a perspective view showing a main portion of an electronic device 303 according to the third preferred embodiment of the present invention. FIG. 16 is a cross-sectional view taken along line D-D in FIG. 15.

The electronic device 303 is different from the electronic device 301 described in the first preferred embodiment in that a plurality of transmission line substrates 101A, 103A, and 103B are provided. Other features of the electronic device 303 are the same or substantially the same as the features of the electronic device 301.

As shown in FIG. 15, transmission line substrates 101A, 103A, and 103B and components 81, 82, and 83 are mounted on the circuit substrate 201 by a conductive bonding material. The transmission line substrates 101A, 103A, and 103B are bonded by a conductive bonding material and define one transmission line substrate.

Figure 20:
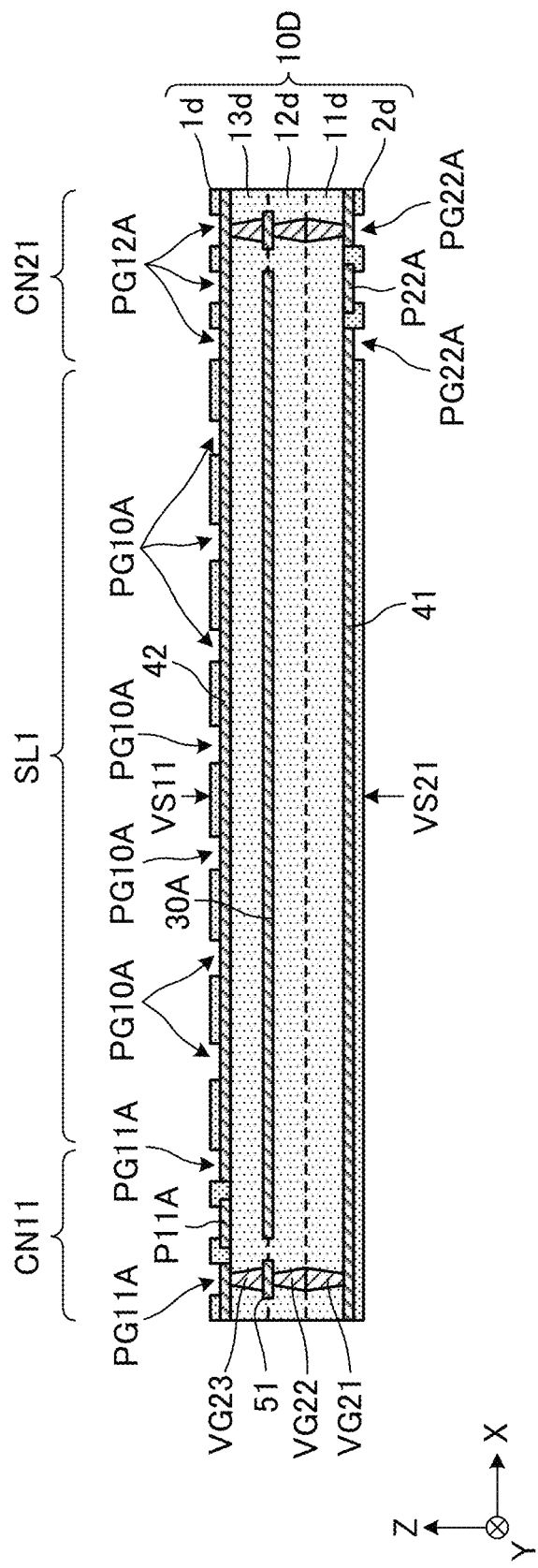
FIG. 20 is a cross-sectional view taken along line E-E in FIG. 18A.
Figure 21A:
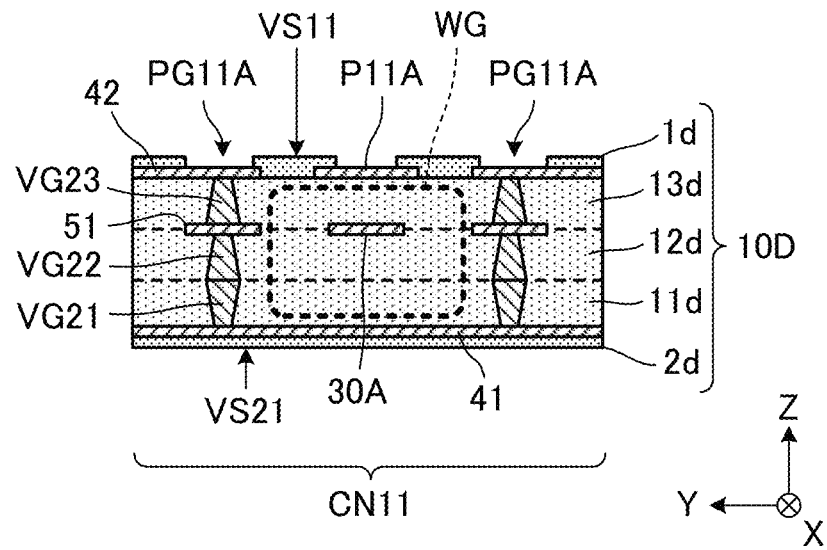
FIG. 21A is a cross-sectional view taken along line F-F in FIG. 18A.
Figure 21B:
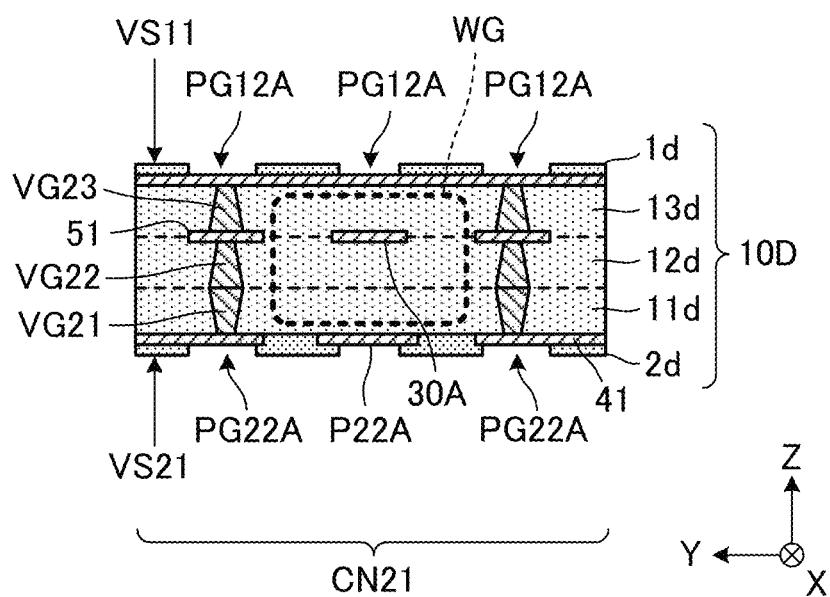
FIG. 21B is a cross-sectional view taken along line G-G in FIG. 18A.
Figure 22A:
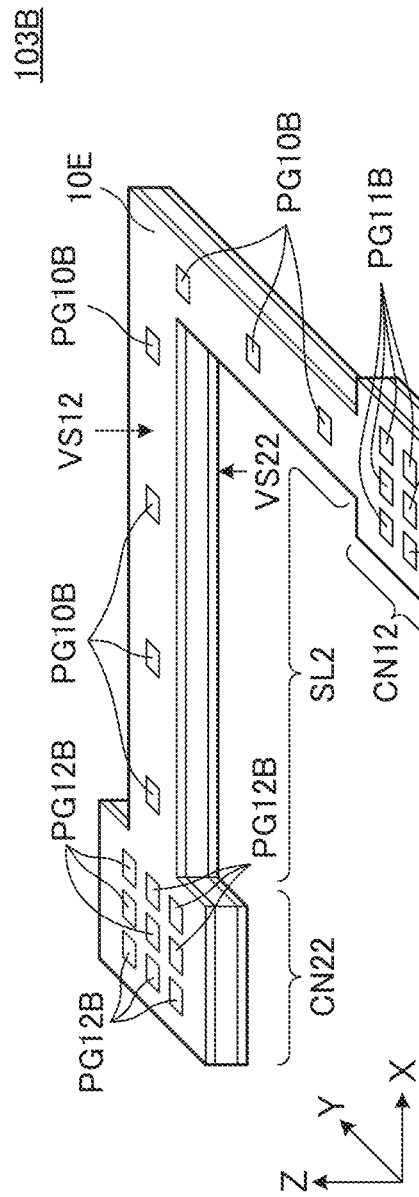
FIG. 22A is an external perspective view of a transmission line substrate according to the third preferred embodiment of the present invention.
Figure 22B:
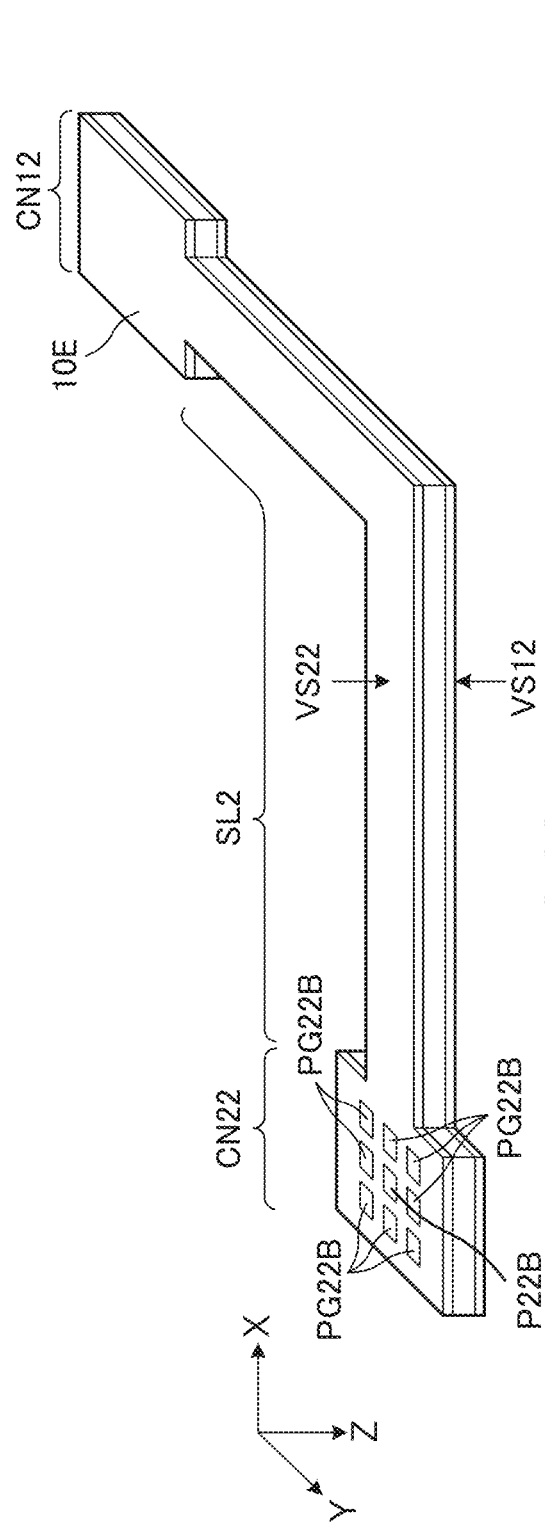
FIG. 22B is an external perspective view of the transmission line substrate 103B viewed from a different viewpoint.

In the present preferred embodiment, the transmission line substrate 101A is an example of the "first transmission line substrate" (shown in FIGS. 17A and 17B), and the transmission line substrates 103A and 103B are examples of the "second transmission line substrate" (transmission line substrate 103A shown in FIGS. 18A, 18B, 19, 20, 21A, and 21B and transmission line substrate 103B shown in FIGS. 22A and 22B).

Subsequently, a specific implementation of each transmission line substrate will be described. FIG. 17A is an external perspective view of the transmission line substrate 101A according to the third preferred embodiment, and FIG. 17B is an external perspective view of the transmission line substrate 101A viewed from a different viewpoint. The transmission line substrate 101A includes a line portion SL and connecting portions CN1 and CN2. In the transmission line substrate 101A, the connecting portion CN1, the line portion SL, and the connecting portion CN2 are provided in this order in a positive Y direction. The transmission line substrate 101A is different from the transmission line substrate 101 according to the first preferred embodiment in that a base material 10C of which the longitudinal direction coincides with a Y-axis direction is provided. Other features of the transmission line substrate 101A are the same or substantially the same as the features of the transmission line substrate 101 according to the first embodiment.

In the present preferred embodiment, external electrodes P11 and P12 of the transmission line substrate 101A each correspond to a "second external electrode", and ground electrodes PG11 and PG12 of the transmission line substrate 101A each correspond to a "second ground electrode". The "second external electrode" refers to an electrode to be bonded to an external electrode of another transmission line substrate, and the "second ground electrode" refers to an electrode to be bonded to a ground electrode of another transmission line substrate.

Figure 19:
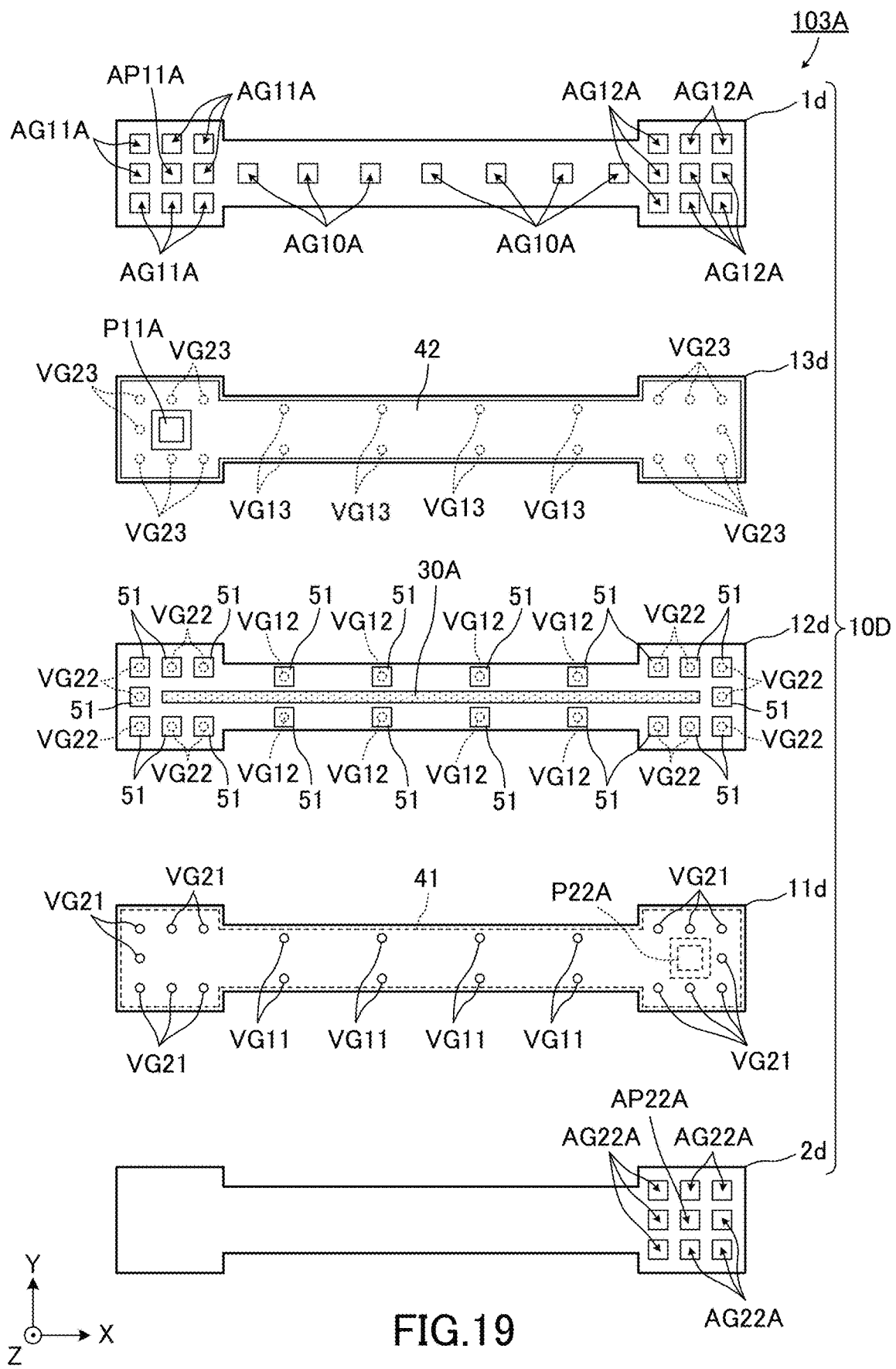
FIG. 19 is an exploded plan view of the transmission line substrate.

Subsequently, a specific implementation of the transmission line substrate 103A will be described. FIG. 18A is an external perspective view of the transmission line substrate 103A according to the third preferred embodiment, and FIG. 18B is an external perspective view of the transmission line substrate 103A viewed from a different viewpoint. FIG. 19 is an exploded plan view of the transmission line substrate 103A. FIG. 20 is a cross-sectional view taken along line E-E in FIG. 18A. FIG. 21A is a cross-sectional view taken along line F-F in FIG. 18A, and FIG. 21B is a cross-sectional view taken along line G-G in FIG. 18A.

As shown in FIGS. 18A and 18B, the transmission line substrate 103A includes a line portion SL1 and connecting portions CN11 and CN21. In the transmission line substrate 103A, the connecting portion CN11, the line portion SL1, and the connecting portion CN21 are provided in this order in the positive X direction. The transmission line substrate 103A is different from the transmission line substrate 101 according to the first preferred embodiment in that a base material 10D, an external electrode P11A, an external electrode P22A, a plurality of ground electrodes PG10A, PG11A, PG12A, PG22A, and the like are provided.

In the present preferred embodiment, the external electrode P11A of the transmission line substrate 103A corresponds to the "first external electrode", and the ground electrodes PG10A, PG1/A, and PG12A each correspond to the "first ground electrode". In addition, the external electrode P22A of the transmission line substrate 103A corresponds to the "second external electrode", and the ground electrode PG22A corresponds to the "second ground electrode".

The base material 10D is a flat plate having a rectangular or substantially rectangular shape of which the longitudinal direction coincides with the X-axis direction, and includes a first main surface VS11 and a second main surface VS21 that face each other. As shown in FIG. 18A, the external electrode P11A and a plurality of ground electrodes PG11A are provided on the first main surface VS11 of the connecting portion CN11, and the plurality of ground electrodes PG12A are provided on the first main surface VS11 of the connecting portion CN21. A plurality of ground electrodes PG10A are provided on the first main surface VS11 of the line portion SL. In addition, as shown in FIG. 18B, the external electrode P22A and a plurality of ground electrodes PG22A are provided on the second main surface VS21 of the connecting portion CN21.

As shown in FIG. 19, the base material 10D is provided by stacking a protective layer 2d, a plurality of base material layers 11d, 12d, and 13d, and a protective layer 1d in this order. The plurality of base material layers 11d to 13d are substantially rectangular flat resin plates of which the longitudinal direction coincides with the X-axis direction. Specifically, the plurality of base material layers 11d to 13d have a width (a width in the Y-axis direction) of both ends (the left end and right end of the base material layers 11d to 13d in FIG. 19) in the longitudinal direction, the width being larger than other portions. The main material of the plurality of base material layers 11d to 13d is the same as the main material of the base material layers 11 to 14 described in the first preferred embodiment.

The external electrode P22A and the first ground conductor 41 are provided on a back surface of the base material layer 11d. The external electrode P22A is a rectangular or substantially rectangular conductor pattern located near a second end (the right end of the base material layer 11d in FIG. 19) of the base material layer 11d. The first ground conductor 41 is a conductor pattern provided on substantially the entire back surface of the base material layer 11d. In addition, a plurality of first interlayer connection conductors VG11 and a plurality of second interlayer connection conductors VG21 are provided in the base material layer 11d. The features of the first interlayer connection conductors VG11 and the second interlayer connection conductors VG21 are the same or substantially the same as the features of the interlayer connection conductor described in the first preferred embodiment.

A signal line 30A and a plurality of intermediate ground conductors 51 are provided on a front surface of the base material layer 12d. The features of the signal line 30A and the intermediate ground conductors 51 are the same or substantially the same as the features of the signal line and the intermediate ground conductor that are described in the first preferred embodiment. In addition, a plurality of first interlayer connection conductors VG12 and a plurality of second interlayer connection conductors VG21 are provided in the base material layer 12d. The features of the first interlayer connection conductors VG12 and the second interlayer connection conductors VG22 are the same or substantially the same as the features of the interlayer connection conductor described in the first preferred embodiment.

The external electrode P11A and the second ground conductor 42 are provided on a front surface of the base material layer 13d. The external electrode P11A is a rectangular or substantially rectangular conductor pattern located near a first end (the left end of the base material layer 13d in FIG. 19) of the base material layer 13d. The second ground conductor 42 is a conductor pattern provided on substantially the entire front surface of the base material layer 13d. In addition, a plurality of first interlayer connection conductors VG13 and a plurality of second interlayer connection conductors VG23 are provided in the base material layer 13d. The features of the first interlayer connection conductors VG13 and the second interlayer connection conductors VG23 are the same or substantially the same as the features of the interlayer connection conductor described in the first preferred embodiment.

The protective layer 1d is a protective film provided on the front surface of the base material layer 13d, and the planar shape of the protective layer id is substantially the same as the planar shape of the base material layer 13d. The protective layer 1d includes rectangular or substantially rectangular openings AP11A, AG10A, AG11A, and AG12A. The openings AP11A and AG11A are located near a first end (the left end of the protective layer 1d in FIG. 19) of the protective layer 1d, the openings AG12A are located near a second end (the right end of the protective layer 1d in FIG. 19) of the protective layer 1d, and the openings AG10A are located near the center of the longitudinal direction of the protective layer 1d. Specifically, the opening AP11A is provided at a position corresponding to the position of the external electrode P11A. Therefore, even when the protective layer 1d is provided on a front surface of the base material layer 13d, the external electrode P11A is exposed from the opening AP11A to the outside. In addition, when the protective layer 1d is provided on the front surface of the base material layer 13d, a portion of the second ground conductor 42 is exposed from the openings AG10A, AG11A, and AG12A to the outside. In the present preferred embodiment, the portion of the second ground conductor 42 that is exposed from each of the openings AG11A and AG12A corresponds to the ground electrode (PG10A, PG11A, PG12A).

The protective layer 2d is a protective film provided on a back surface of the base material layer 11d, and the planar shape of the protective layer 2d is the same or substantially the same as the planar shape of the base material layer 11d. The protective layer 2d includes rectangular or substantially rectangular openings AP22A and AG22A. The openings AP22A and AG22A are located near a second end (the right end of the protective layer 2d in FIG. 19) of the protective layer 2d, Specifically, the opening AP22A is provided at a position corresponding to the position of the external electrode P22A. Therefore, even when the protective layer 2d is provided on the back surface of the base material layer 11d, the external electrode P22A is exposed from the opening AP22A to the outside. In addition, when the protective layer 2d is provided on the back surface of the base material layer 11d, a portion of the first ground conductor 41 is exposed from the openings AG22A to the outside. In the present preferred embodiment, the portion of the first ground conductor 41 that is exposed from the openings AG22A corresponds to the ground electrode (PG22A).

As shown in FIG. 19, FIG. 20, and FIGS. 21A and 21B, the first ground conductor 41 and the second ground conductor 42 are electrically connected to each other through the intermediate ground conductors 51 and 52 and the interlayer connection conductors (the first interlayer connection conductors VG11 to VG13 or the second interlayer connection conductors VG21 to VG23).

In addition, in the line portion SL1 of the transmission line substrate 103A, a transmission line of a strip line structure including the signal line 30A, the first ground conductor 41, the second ground conductor 42, the base material layers 11d and 12d located between the signal line 30A and the first ground conductor 41, and the base material layer 13d located between the signal line 30A and the second ground conductor 42 is provided.

As shown in FIG. 21A, in the connecting portion CN11 of the transmission line substrate 103A, the signal line 30A and the external electrode P11A face each other in the stacking direction (the Z-axis direction), without interposing an interlayer connection conductor therebetween. Further, as shown in FIG. 21B, in the connecting portion CN21, the signal line 30A and the external electrode P22A face each other in the Z-axis direction, without interposing an interlayer connection conductor therebetween.

Subsequently, a specific implementation of the transmission line substrate 103B will be described. FIG. 22A is an external perspective view of a transmission line substrate 103B according to the third preferred embodiment, and FIG. 22B is an external perspective view of the transmission line substrate 103B viewed from a different viewpoint. As shown in FIGS. 22A and 22B, the transmission line substrate 103B includes a line portion SL2 and connecting portions CN12 and CN22. In the transmission line substrate 103A, the connecting portion CN12, the line portion SL2, and the connecting portion CN22 are provided in this order in the positive X direction. The transmission line substrate 103B is different from the transmission line substrate 103A in that a base material 10E having an L shape extending in a plane direction (the X-axis direction and the Y-axis direction) is provided. Other basic structures of the transmission line substrate 103B are the same as the transmission line substrate 103A, and the description will be omitted.

In the present preferred embodiment, as shown in FIG. 22A, the external electrode P11B of the transmission line substrate 103B corresponds to the "first external electrode", and the ground electrodes PG10B, PG11B, and PG12B each correspond to the "first ground electrode". In addition, as shown in FIG. 22B, the external electrode P22B of the transmission line substrate 103B corresponds to the "second external electrode", and the ground electrode PG22B corresponds to the "second ground electrode."

As shown in FIG. 15 and FIG. 16, the transmission line substrates 103A and 103B, while each of the first main surfaces VS11 and VS12 faces the main surface PS1 of the circuit substrate 201, are mounted to the circuit substrate 201. In addition, the first main surface VS1 of the connecting portion CN1 of the transmission line substrate 101A is bonded to the second main surface VS21 of the connecting portion CN21 of the transmission line substrate 103A, and the first main surface VS1 of the connecting portion CN2 of the transmission line substrate 101A is bonded to the second main surface VS22 of the connecting portion CN22 of the transmission line substrate 103B.

As shown in FIG. 16, a substrate electrode EP31, substrate ground electrode EG12A and EG12B, and the like are provided on the main surface PS1 of the circuit substrate 201. The first ground electrode (the ground electrode PG12A in FIG. 18A) of the transmission line substrate 103A is bonded to the substrate ground electrode EG12A of the circuit substrate 201 through the conductive bonding material. The first ground electrode (the ground electrode PG12B in FIG. 22A) of the transmission line substrate 103B is bonded to the substrate ground electrode EG12B of the circuit substrate 201 through the conductive bonding material. Although not shown, the external electrodes (P11A and P11B) of the transmission line substrates 103A and 103B are also bonded to the substrate electrode of the circuit substrate 201 through the conductive bonding material. Further, the component 83 is bonded to the substrate electrode EP31 of the circuit substrate 201 through the conductive bonding material. Although not shown, the components 81 and 82 are also bonded to the circuit substrate 201 through the conductive bonding material.

Furthermore, the second external electrodes (the external electrodes P11 and P22A) of the transmission line substrates 101A and 103A are bonded through the conductive bonding material, and the second external electrodes (the external electrodes P12 and P22B) of the transmission line substrates 101A and 103B are bonded through the conductive bonding material.

Accordingly, the second external electrodes are bonded to each other through the conductive bonding material, and, as shown in FIG. 15, the plurality of transmission line substrates 101A, 103A, and 103B define one transmission line substrate that includes a bent portion in the plane direction. As shown in FIG. 16, the signal line 30A and the second external electrodes (the external electrodes P11 and P12) of the transmission line substrate 101A face each other in the Z-axis direction, without interposing an interlayer connection conductor therebetween. In addition, the signal line 30A and the second external electrode (the external electrode P22A) of the transmission line substrate 103A face each other in the Z-axis direction, without interposing an interlayer connection conductor therebetween. Further, the signal line 30A and the second external electrode (the external electrode P22B) of the transmission line substrate 103B face each other in the Z-axis direction, without interposing an interlayer connection conductor therebetween.

According to the present preferred embodiment, the following advantageous effects in addition to the advantageous effects described in the first preferred embodiment are provided.

(a) The transmission line substrate being a cable or a surface mount component is generally manufactured by a process of manufacturing a transmission line substrate as a mother substrate and then dividing the mother substrate into a plurality of individual pieces. However, in a case in which a structure having a shape including a bent portion in the plane direction is separated from the mother substrate, the number of structures to be provided from the mother substrate is reduced, for example, which has a large effect on the number of pieces to be provided. In contrast, in the present preferred embodiment, the plurality of transmission line substrates 101A, 103A, and 103B are bonded to define one transmission line substrate. Accordingly, one transmission line substrate is able to be provided by bonding small individual pieces (a plurality of transmission line substrates) separated from the mother substrate, and the number (the number of provided pieces) of transmission line substrates to be provided from the one mother substrate is increased.

(b) In the present preferred embodiment, as shown in FIG. 16, the component 83 mounted on the circuit substrate 201 is passed over (avoided) by mounting (placing) the transmission line substrate 101A on the transmission line substrates 103A and 103B that are mounted to the circuit substrate 201. Accordingly, space in a height direction (the Z-axis direction) perpendicular to the main surface PS1 of the circuit substrate 201 is able to be used effectively.

(c) In addition, in the present preferred embodiment, the length in the longitudinal direction (the Y-axis direction) of the transmission line substrate 101A is smaller than the length in the longitudinal direction (the X-axis direction) of the transmission line substrates 103A and 103B mounted to the circuit substrate 201. The transmission line substrate 101A is able to be made difficult to deform (bend, or the like) by reducing the length in the longitudinal direction of the transmission line substrate 101A to be mounted on the circuit substrate 201. In other words, the above features are able to increase the structural stability of the transmission line substrate provided by bonding a plurality of transmission line substrates.

(d) Further, in the present preferred embodiment, the width of the connecting portion of the transmission line substrates 103A and 103B mounted to the circuit substrate 201 is larger than the width of the line portion. Accordingly, when the transmission line substrates 103A and 103B are placed on the main surface PS1 of the circuit substrate 201, the transmission line substrates 103A and 103B become difficult to fall, and thus the transmission line substrates 103A and 103B are able to be more easily placed on the main surface PS1 of the circuit substrate 201. In other words, the stability of the transmission line substrates 103A and 103B placed on the circuit substrate 201 is increased, and the mountability of the transmission line substrates 103A and 103B is increased. In addition, the external electrode and the ground electrode that are provided at the connecting portion are able to be increased in size, the mountability (or bondability to other transmission line substrates) to the circuit substrate 201 is increased.

(e) Further, in the present preferred embodiment, the width of the line portion of the transmission line substrates 103A and 103B mounted to the circuit substrate 201 is smaller than the width of the connecting portion. Accordingly, an area to exclusively mount the transmission line substrates 103A and 103B is reduced, and the components 81 to 83, other structures, or the like that are mounted on the main surface PS1 of the circuit substrate 201 are able to be easily avoided, and the transmission line substrates 103A and 103B are able to be more easily mounted in a limited space on the main surface PS1 of the circuit substrate 201.

(f) In the present preferred embodiment, the line portion of the transmission line substrates 103A and 103B includes a plurality of ground electrodes PG10A and PG10B that are provided in the transmission direction. Accordingly, even when the transmission line substrate has a constant or substantially constant length, the transmission line substrate is able to be mounted to the circuit substrate with high position accuracy. Specifically, even when some positional shift occurs while the transmission line substrate is placed on the circuit substrate, the mounting position of the transmission line substrate is corrected by a self-alignment function of the ground electrodes and the substrate ground electrodes, during a reflow process.

While the present preferred embodiment shows an example in which the three transmission line substrates 101A, 103A, and 103B are bonded to define one transmission line substrate, the present invention is not limited to this specific structure. The number of transmission line substrates to be bonded to each other may be two, or four or more, for example.

In addition, while the present preferred embodiment shows an example of the transmission line substrate including one signal line 30A, the present invention is not limited to this specific structure. The transmission line substrate may include a plurality of signal lines. In a case in which transmission line substrates including a plurality of signal lines are bonded to each other, for example, one signal line may be connected to a signal line of another transmission line substrate, and the other signal line may be connected to a signal line of the circuit substrate.

Fourth Preferred Embodiment

In a fourth preferred embodiment of the present (shown in FIGS. 23-26B), an example of a transmission line substrate including no external electrode will be described.

Figure 23:
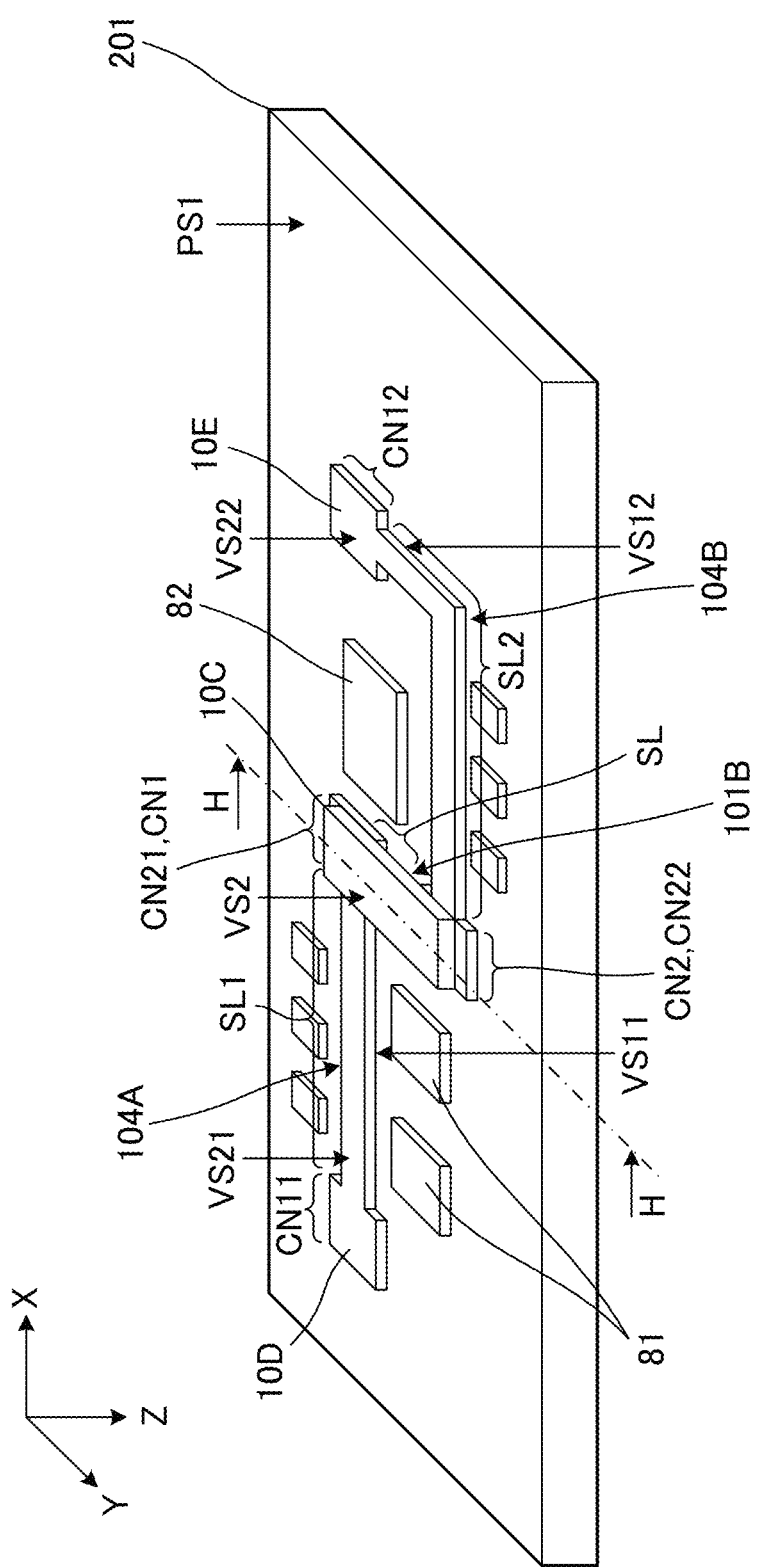
FIG. 23 is a perspective view showing a main portion of an electronic device according to a fourth preferred embodiment of the present invention.
Figure 24:
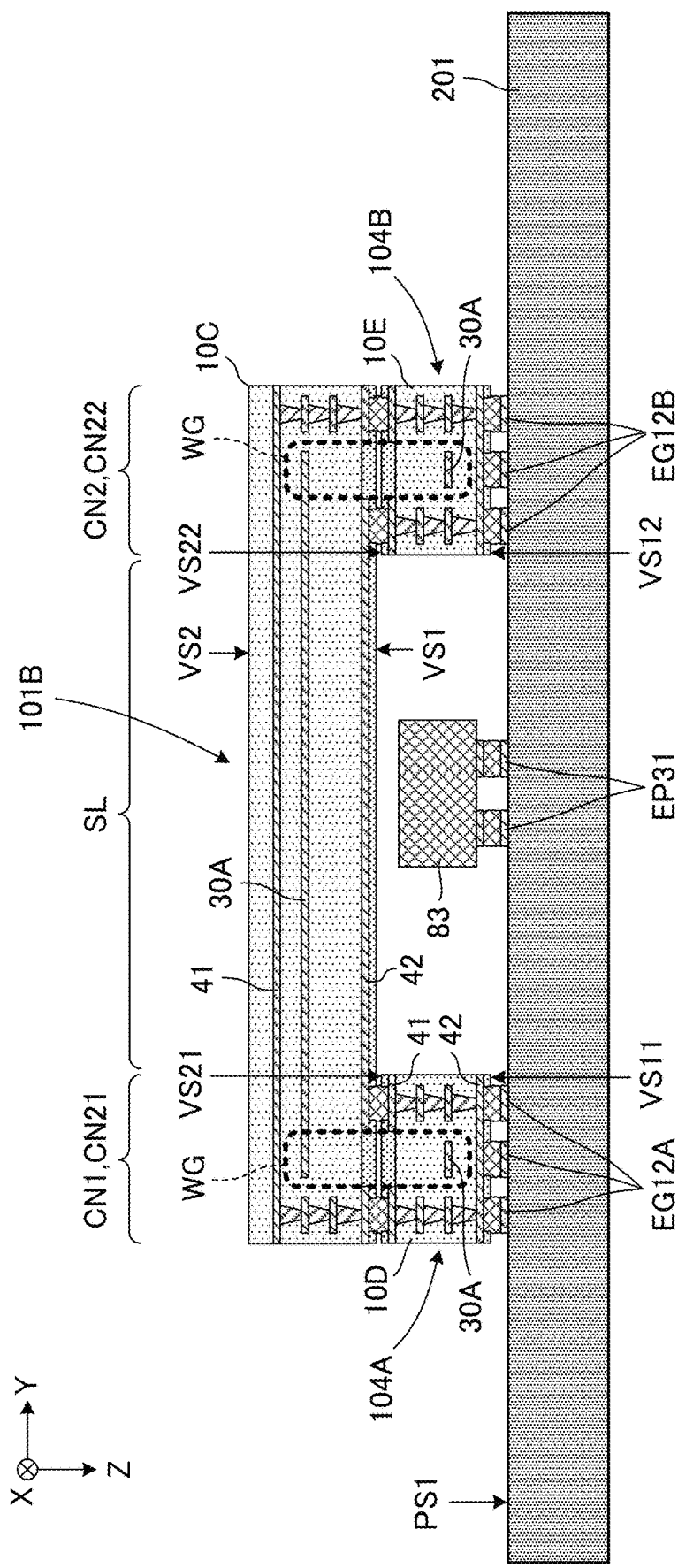
FIG. 24 is a cross-sectional view taken along line H-H in FIG. 23.

FIG. 23 is a perspective view showing a main portion of an electronic device 304 according to the fourth preferred embodiment of the present invention. FIG. 24 is a cross-sectional view taken along line H-H in FIG. 23.

The electronic device 304 is different from the electronic device 303 described in the third preferred embodiment in that a plurality of transmission line substrates 101B, 104A, and 104B are provided. Other features of the electronic device 304 are the same as the features of the electronic device 303.

As shown in FIG. 23, transmission line substrates 101B, 104A, and 104B and components 81 to 83 are mounted on the circuit substrate 201 by a conductive bonding material. The connecting portions are bonded to each other by a conductive bonding material, and the transmission line substrates 101B, 104A, and 104B define one transmission line substrate.

In the present preferred embodiment, the transmission line substrate 101B is an example of the "first transmission line substrate" (shown in FIG. 25), and the transmission line substrates 104A and 104B are examples of the "second transmission line substrate" (shown in FIGS. 26A and 26B).

Figure 25:
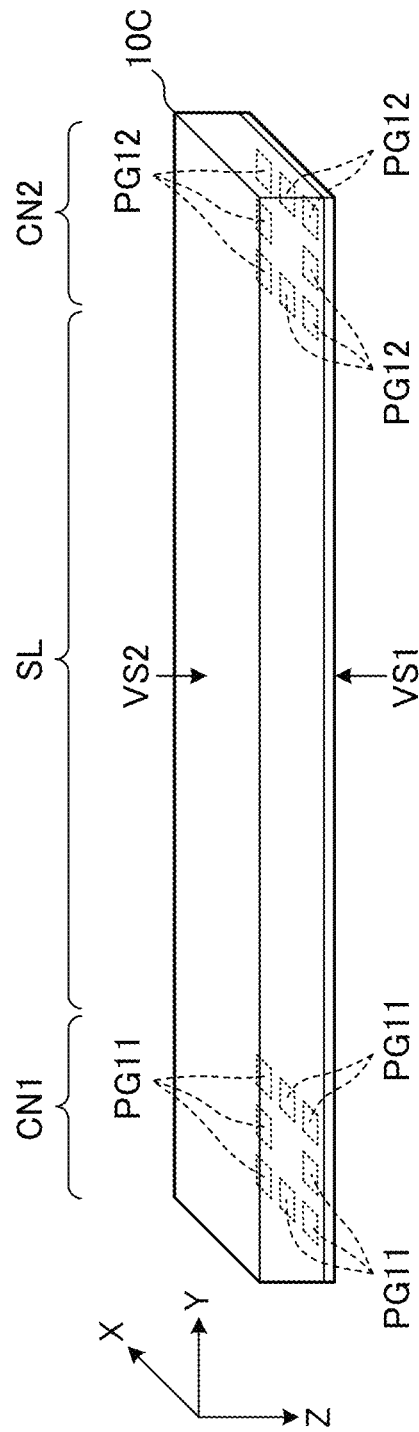
FIG. 25 is an external perspective view of a transmission line substrate according to the fourth preferred embodiment of the present invention.

Subsequently, a specific implementation of each transmission line substrate will be described. FIG. 25 is an external perspective view of the transmission line substrate 101B according to the fourth preferred embodiment. The transmission line substrate 101B is different from the transmission line substrate 101B according to the third preferred embodiment in that an external electrode (P11, P12) is not provided. Other features of the transmission line substrate 101B are substantially the same as the features of the transmission line substrate 101A.

Subsequently, a specific implementation of each of the transmission line substrates 104A and 104B will be described. FIG. 26A is an external perspective view of the transmission line substrate 104A according to the fourth preferred embodiment, and FIG. 26B is an external perspective view of the transmission line substrate 104B according to the fourth preferred embodiment.

The transmission line substrate 104A shown in FIG. 26A is different from the transmission line substrate 103A according to the third preferred embodiment in that an external electrode (P22A) is not provided. In addition, the transmission line substrate 104B shown in FIG. 26B is different from the transmission line substrate 103B according to the third preferred embodiment in that an external electrode (P22B) is not provided. Other features of the transmission line substrates 104A and 104B are the same or substantially the same as the features of the transmission line substrates 103A and 103B.

As shown in FIG. 24, the transmission line substrates 104A and 104B, while each of the first main surfaces VS11 and VS12 faces the main surface PS1 of the circuit substrate 201, are mounted to the circuit substrate 201. In addition, the first main surface VS1 of the connecting portion CN1 of the transmission line substrate 101B is bonded to the second main surface VS21 of the connecting portion CN21 of the transmission line substrate 104A, and the first main surface VS1 of the connecting portion CN2 of the transmission line substrate 101B is bonded to the second main surface VS22 of the connecting portion CN22 of the transmission line substrate 104B.

The first ground electrode (the ground electrode PG12A in FIG. 18A) of the transmission line substrate 104A is bonded to the substrate ground electrode EG12A of the circuit substrate 201 through the conductive bonding material. The first ground electrode (the ground electrode PG12B in FIG. 22A) of the transmission line substrate 104B is bonded to the substrate ground electrode EG12B of the circuit substrate 201 through the conductive bonding material. Although not shown, the first external electrodes (the external electrodes P11A and P11B in FIG. 18A and FIG. 22A) of the transmission line substrates 104A and 104B are bonded to the substrate electrodes of the circuit substrate 201 through the conductive bonding material.

Further, the second ground electrode (the ground electrode PG11 in FIG. 24) of the transmission line substrate 101B and the second ground electrode (the ground electrode PG22A in FIG. 26A) of the transmission line substrate 104A are connected to each other through the conductive bonding material. In addition, the second ground electrode (the ground electrode PG12 in FIG. 25) of the transmission line substrate 101B and the second ground electrode (the ground electrode PG22B in FIG. 26B) of the transmission line substrate 104B are connected to each other through the conductive bonding material.

Accordingly, the plurality of second ground electrodes are bonded to each other through the conductive bonding material, and, as shown in FIG. 23, the plurality of transmission line substrates 101B, 104A, and 104B define one transmission line substrate.

In the present preferred embodiment, as shown in FIG. 24, in the connecting portions CN1 and CN21 that are bonded to each other, the signal lines 30A of the transmission line substrates 101B and 104A face each other and connected in the Z-axis direction without interposing an interlayer connection conductor and a conductive bonding material therebetween. Specifically, in the connecting portions CN1 and CN21, a facing portion (a portion in which the signal lines 30A face each other in the Z-axis direction) in which the signal line 30A of the transmission line substrate 101B faces the signal line 30A of the transmission line substrate 104A defines and functions as a waveguide WG extending in the Z-axis direction.

In addition, in the connecting portions CN2 and CN22 that are bonded to each other, the signal line 30A of the transmission line substrate 101B and the signal line 30A of the transmission line substrate 104B face each other in the Z-axis direction without interposing an interlayer connection conductor and a conductive bonding material therebetween. Specifically, in the connecting portions CN2 and CN22, a facing portion in which the signal line 30A of the transmission line substrate 101B faces the signal line 30A of the transmission line substrate 104B defines and functions as a waveguide WG extending in the Z-axis direction.

In the present preferred embodiment, the signal lines 30A of the transmission line substrates 101B, 104A, and 104B to be bonded to each other are connected to each other without interposing a conductive bonding material therebetween, and, in comparison with a case (see the electronic device 303 according to the third preferred embodiment) in which the signal lines of the transmission line substrate are connected by a conductive bonding material, impedance matching is easy.

While the present preferred embodiment shows an example in which the plurality of transmission line substrates 101B, 104A, and 104B are bonded to each other through the conductive bonding material and define one transmission line substrate, the present invention is not limited to this specific structure. As shown in the present preferred embodiment, in a case in which the waveguide WG passing over the two transmission line substrates bonded to each other is provided, the plurality of transmission line substrates may be bonded to each other by an insulating adhesive material or the like and may define one transmission line substrate. However, the plurality of transmission line substrates are preferably bonded to each other, for example, by a conductive bonding material in that the plurality of transmission line substrates are bonded to each other with high position accuracy. For example, in the connecting portions CN1 and CN21 that are bonded to each other, the mounting positions of the connecting portions CN1 and CN2 are corrected by a self-alignment function between the second ground electrodes (the ground electrode PG11 of the transmission line substrate 101B and the ground electrode PG22A of the transmission line substrate 104A) during a reflow process.

In addition, while the present preferred embodiment shows an example in which the waveguide WG passing over the two transmission line substrates 101B and 104A (or the transmission line substrates 101B and 104B bonded to each other) that are bonded to each other is provided, the present invention is not limited to this specific structure. For example, a waveguide passing over the transmission line substrate and the circuit substrate 201 (a different substrate) may be provided. In other words, by mounting a transmission line substrate including no first external electrode to a circuit substrate including no substrate electrode, the signal line of the transmission line substrate and a signal line (a base substrate signal line) included in a circuit substrate may face each other and connected in the Z-axis direction, without including therebetween an interlayer connection conductor or the like. Accordingly, the base substrate signal line is preferably not connected to an interlayer connection conductor, for example.

Other Preferred Embodiments

While each of the above described preferred embodiments shows an example of the transmission line substrate including two connecting portions and one line portion, the number of connecting portions and the number of line portions included in the transmission line substrate are able to be appropriately changed in the scope in which the advantageous functions and effects of the present invention are provided.

While each of the above-described preferred embodiments shows an example in which the base material of the transmission line substrate is a rectangular or substantially rectangular flat plate, the present invention is not limited to this specific structure. The shape of the base material is able to be appropriately changed within the scope of advantageous functions and effects of the preferred embodiments of the present invention. The planar shape of the base material may be a polygon, a circle, an ellipse, an L shape, a crank shape, a T shape, a Y shape, a U shape, or the like, for example.

In addition, while each of the above-described preferred embodiments shows an example of the transmission line substrate including the base material provided by stacking one protective layer and four base material layers or the base material provided by stacking two protective layers and three base material layers, the present invention is not limited to this specific structure. The number of stacked layers of the base material layer included in the base material is able to be appropriately changed within the scope of advantageous functions and effects of the preferred embodiments of the present invention. Further, the protective layer may be omitted from the base material.

While each of the above-described preferred embodiments of the present invention shows an example in which the plurality of base material layers included in the base material include a thermoplastic resin, the present invention is not limited to this specific material. The plurality of base material layers may be sheets including a thermosetting resin. In addition, the plurality of base material layers may be dielectric ceramic sheets of low temperature co-fired ceramics (LTCC). In addition, the base material may be a composite stacked body of a plurality of resins, or may be provided by stacking a thermosetting resin sheet such as a glass epoxy substrate, for example, and a thermoplastic resin sheet. Further, the base material is not limited to a base material including a plurality of base material layers of which the surfaces are fused by heating and pressing (collectively pressing) the plurality of base material layers, and may include an adhesive layer between each of the plurality of base material layers.

In addition, the circuitry provided in the transmission line substrate is not limited to the circuitry described in each of the above preferred embodiments and is able to be appropriately changed within the scope of advantageous functions and effects of the preferred embodiments of the present invention. In the circuit provided in the transmission line substrate, for example, a coil defined by a conductor pattern, a capacitor defined by a conductor pattern, or a frequency filter such as various filters (a low-pass filter, a high-pass filter, a band-pass filter, and a band-elimination filter) may be provided. Further, in addition to a transmission line of a strip line structure, for example, various types of transmission lines (such as a meander and a coplanar) may be provided in the transmission line substrate. Further, various electronic components, for example, a chip component, may be mounted on or embedded in the transmission line substrate.

While each of the above-described preferred embodiments shows an example of the transmission line substrate including one transmission line at the line portion, the present invention is not limited to this specific structure. The number of transmission lines is able to be appropriately changed, depending on the circuitry provided in the transmission line substrate, and may be two or more. In a case in which two or more transmission lines are provided, the two or more transmission lines may be used by the same system (the same frequency band) or may be used by different systems (a different frequency band).

In addition, while each of the above-described preferred embodiments shows an example in which the planar shape of each conductor pattern (the external electrode, the ground electrode, the ground conductor, the intermediate ground conductor, or the like) is a rectangle, the present invention is not limited to this specific shape. The planar shape of each conductor pattern is able to be appropriately changed within the scope of advantageous functions and effects of the preferred embodiments of the present invention, and may be a polygon, a circle, an ellipse, an arc, a ring, an L shape, a U shape, a T shape, a Y shape, and a crank shape, for example. Further, the number of electrodes and the position of each electrode (the external electrode and the ground electrode) are able to be appropriately changed in the scope in which the advantageous functions and effects of the present invention. In addition to the electrodes, a dummy electrode that is not connected to a signal line or a ground may be provided on the transmission line substrate.

Furthermore, while each of the above-described preferred embodiments shows an example in which the plurality of interlayer connection conductors (the first interlayer connection conductors VG11 to VG13 and the second interlayer connection conductors VG21 to VG23) each are a via conductor provided by solidifying the conductive bonding material with which a through hole provided in the base material layer is filled, by a heating and pressing process, the present invention is not limited to this specific implementation. The interlayer connection conductor provided in the transmission line substrate may be a conductor including a plated via (a plated through hole or a plated filled via) provided by a plating process in a through hole provided in a base material layer, and a conductive bonding material bonded to the plated via, for example.

In a case in which a multilayer resin substrate is intended to be used as a high frequency transmission line, although Cu having a small conductor loss is preferably used for a wiring conductor, Cu has a high melting point. Then, although the conductive bonding material of which the melting point is lower than the melting point of Cu is used for an interlayer connection conductor, the interlayer connection conductor including only the conductive bonding material has a relatively low conductivity. In contrast, in a case in which the plated via and the conductive bonding material are used in combination to provide the interlayer connection conductor, in comparison with the interlayer connection conductor including only the conductive bonding material, a conductor loss is able to be reduced. In a case in which an interlayer connection conductor includes a plated via, a conductor pattern to be connected to the plated via and the plated via preferably include the same material (Cu, for example). Accordingly, the plated via and the conductor pattern are integrated together, and an alloy layer (an intermetallic compound) is rarely provided at a portion that connects the plated via and the conductor pattern, and thus the mechanical strength of the portion that connects the plated via and the conductor pattern is increased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line substrate comprising:
   a line portion;
   a connecting portion;
   a base material including a main surface and a plurality of base material layers stacked on each other;
   a first ground conductor on at least one of the base material layers;
   a second ground conductor on at least one of the base material layers;
   a signal line on at least one of the base material layers;
   an external electrode of the connecting portion, the external electrode being on the main surface of the base material; and
   a plurality of interlayer connection conductors in the base material; wherein
   in the line portion, a transmission line having a strip line structure including the signal line, the first ground conductor, and the second ground conductor is provided;
   the connecting portion includes a facing portion in which the signal line and the external electrode face each other in a stacking direction in which the plurality of base material layers are stacked on each other, without interposing an interlayer connection conductor therebetween;
   the plurality of interlayer connection conductors include a plurality of first interlayer connection conductors and a plurality of second interlayer connection conductors that electrically connect the first ground conductor and the second ground conductor;
   the plurality of first interlayer connection conductors are provided at the line portion, and, when viewed in the stacking direction, are provided along the signal line;
   the plurality of second interlayer connection conductors are provided at the connecting portion, and surround the facing portion;
   a portion of the plurality of second interlayer connection conductors is provided in at least one of the plurality of base material layers provided between a portion of the signal line and the external electrode, the portion of the signal line facing the external electrode; and
   an interval of the plurality of second interlayer connection conductors is smaller than an interval of the plurality of first interlayer connection conductors.

2. The transmission line substrate according to claim 1, wherein the signal line is not connected to the plurality of interlayer connection conductors.

3. The transmission line substrate according to claim 1, wherein
   the main surface of the base material includes a first main surface and a second main surface that face each other;
   the external electrode includes a plurality of external electrodes; and the plurality of external electrodes are provided on each of the first main surface and the second main surface.

4. The transmission line substrate according to claim 1, wherein a total value of a length of a line segment that connects a series of second interlayer connection conductors surrounding the facing portion among the plurality of second interlayer connection conductors traverses the second interlayer connection conductors is larger than a total value of an interval of the second interlayer connection conductors on a line segment that connects the series of second interlayer connection conductors.

5. The transmission line substrate according to claim 1, wherein the plurality of second interlayer connection conductors, when viewed in the stacking direction, are provided in a staggered pattern.

6. The transmission line substrate according to claim 5, wherein, in two second interlayer connection conductors among the plurality of second interlayer connection conductors, and an additional second interlayer connection conductor among the plurality of second interlayer connection conductors, the two second interlayer connection conductors being adjacent to each other along the facing portion, at least a portion of the additional second interlayer connection conductor overlaps a region interposed between two straight lines passing a point at which a line segment that connects the two second interlayer connection conductors in a direction along the facing portion and the two second interlayer connection conductors intersect and extending in a direction orthogonal to the line segment.

7. The transmission line substrate according to claim 6, wherein the additional second interlayer connection conductor is provided at a position over the two straight lines.

8. The transmission line substrate according to claim 6, wherein the additional second interlayer connection conductor is entirely or substantially entirely provided in the region interposed between the two straight lines.

9. The transmission line substrate according to claim 1, further comprising an intermediate ground conductor in the base material.

10. The transmission line substrate according to claim 1, further comprising:
a second connecting portion including a second external electrode; wherein
the connecting portion and the second connecting portion are connected to each other by the line portion.

11. The transmission line substrate according to claim 10, wherein the plurality of second interlayer connection conductors are provided at the second connecting portion.

12. The transmission line substrate according to claim 1, wherein
the plurality of base material layers include a first base material layer, a second base material layer, a third base material layer, and a fourth base material layer that are stacked in this order;
the first ground conductor is on a surface of the first base material layer;
the signal line is on a surface of the second base material layer;
the external electrode is on a surface of the fourth base material layer; and
the plurality of interlayer connection conductors are on at least one of the surface of the second base material layer, a surface of the third base material layer, and the surface of the fourth base material layer.

13. The transmission line substrate according to claim 12, wherein a protective film is on the surface of the fourth base material layer; and
the protective film includes an opening located at a position corresponding to a position of the external electrode on the surface of the fourth bae material layer.

14. A structure of mounting a transmission line substrate to a different substrate by a conductive bonding material, wherein
the transmission line substrate includes:
a line portion;
a connecting portion;
a base material including a main surface and a plurality of base material layers that are stacked on each other;
a first ground conductor on at least one of the plurality of base material layers;
a second ground conductor on at least one of the plurality of base material layers;
a signal line on at least one of the plurality of base material layers;
a first external electrode of the connecting portion, the first external electrode being on the main surface of the base material; and
a plurality of interlayer connection conductors in the base material;
in the line portion, a transmission line having a strip line structure including the signal line, the first ground conductor, and the second ground conductor is provided;
the connecting portion includes a facing portion in which the signal line and the first external electrode face each other in a stacking direction in which the plurality of base material layers are stacked on each other, without interposing an interlayer connection conductor therebetween;
the plurality of interlayer connection conductors include a plurality of first interlayer connection conductors and a plurality of second interlayer connection conductors that electrically connect the first ground conductor and the second ground conductor;
the plurality of first interlayer connection conductors are provided at the line portion, and, when viewed in the stacking direction, are provided along the signal line;
the plurality of second interlayer connection conductors are provided at the connecting portion, and surround the facing portion;
a portion of the plurality of second interlayer connection conductors is provided in at least one of the plurality of base material layers provided between a portion of the signal line and the external electrode, the portion of the signal line facing the external electrode;
an interval of the plurality of second interlayer connection conductors is smaller than an interval of the plurality of first interlayer connection conductors;
the different substrate includes a substrate electrode on a main surface of the different substrate; and
the first external electrode is bonded to the substrate electrode through the conductive bonding material.

15. The structure of mounting a transmission line substrate according to claim 14, wherein
the transmission line substrate includes a first transmission line substrate and a second transmission line substrate;
the first transmission line substrate and the second transmission line substrate each include a second external electrode of the connecting portion, the second external electrode being on the main surface of the base material;

the second external electrode of the first transmission line substrate and the second external electrode of the second transmission line substrate are bonded to each other through the conductive bonding material, and define one transmission line substrate; and in at least one of the first transmission line substrate and the second transmission line substrate, the signal line of the connecting portion and the second external electrode face each other in the stacking direction of the plurality of base material layers without interposing the interlayer connection conductor therebetween.

16. The structure of mounting a transmission line substrate according to claim 15, wherein the different substrate includes a substrate signal line; and
the substrate signal line is not connected to the interlayer connection conductor.

17. The structure of mounting a transmission line substrate according to claim 14, wherein the transmission line substrate includes a first transmission line substrate and a second transmission line substrate;

in the first transmission line substrate and the second transmission line substrate, the connecting portion of the first transmission line substrate and the connecting portion of the second transmission line substrate are bonded to each other and define one transmission line substrate; and in the connecting portion of the first transmission line substrate and the connecting portion of the second transmission line substrate that are bonded to each other, the signal line of the first transmission line substrate and the signal line of the second transmission line substrate face each other in the stacking direction of the plurality of base material layers, without the interlayer connection conductor and the conductive bonding material.

18. The structure of mounting a transmission line substrate according to claim 14, wherein the signal line is not connected to the interlayer connection conductor.

19. A structure of mounting a transmission line substrate to a different substrate by a conductive bonding material, wherein the transmission line substrate includes:
a line portion;
a connecting portion;
a base material including a main surface and a plurality of base material layers that are stacked on each other;
a first ground conductor on at least one of the plurality of base material layers;
a second ground conductor on at least one of the plurality of base material layers;
a signal line on at least one of the plurality of base material layers;
a first ground electrode of the connecting portion, the first ground electrode being on the main surface of the base material and being electrically connected to the first ground conductor and the second ground conductor; and
a plurality of interlayer connection conductors in the base material;

in the line portion, a transmission line having a strip line structure including the signal line, the first ground conductor, and the second ground conductor is provided;

the different substrate includes a substrate signal line and a substrate ground electrode provided on a surface;

the first ground electrode is bonded to the substrate ground electrode through the conductive bonding material;

while the transmission line substrate is mounted on the different substrate, a facing portion is provided in which the signal line of the connecting portion and the substrate signal line face each other in a stacking direction in which the plurality of base material layers are stacked on each other, without an interlayer connection conductor and a conductive bonding material;

the plurality of interlayer connection conductors include a plurality of first interlayer connection conductors and a plurality of second interlayer connection conductors that electrically connect the first ground conductor and the second ground conductor;

the plurality of first interlayer connection conductors are provided at the line portion, and, when viewed in the stacking direction, are provided along the signal line;

while the transmission line substrate is mounted on the different substrate, the plurality of second interlayer connection conductors are provided at the connecting portion, and, when viewed in the stacking direction, surround the facing portion;

a portion of the plurality of second interlayer connection conductors is provided in at least one of the plurality of base material layers provided between a portion of the signal line and the main surface of the base material, the portion of the signal line facing the substrate signal line; and an interval of the plurality of second interlayer connection conductors is smaller than an interval of the plurality of first interlayer connection conductors.

\* \* \* \* \*